(12) United States Patent
Bouet et al.

(10) Patent No.: US 9,153,453 B2
(45) Date of Patent: Oct. 6, 2015

(54) TECHNIQUE FOR ETCHING MONOLAYER AND MULTILAYER MATERIALS

(75) Inventors: Nathalie C. D. Bouet, Wading River, NY (US); Raymond P. Conley, Manorville, NY (US); Ralu Divan, Darien, IL (US); Albert Macrander, Naperville, IL (US)

(73) Assignees: Brookhaven Science Associates, LLC, Upton, NY (US); UChicago Argonne, LLC, Chicago, IL (US)

( * ) Notice: Subject to any disclaimer, the term of this patent is extended or adjusted under 35 U.S.C. 154(b) by 0 days.

(21) Appl. No.: 13/371,124

(22) Filed: Feb. 10, 2012

(65) Prior Publication Data

US 2012/0205785 A1  Aug. 16, 2012

Related U.S. Application Data

(60) Provisional application No. 61/442,040, filed on Feb. 11, 2011, provisional application No. 61/504,013, filed on Jul. 1, 2011.

(51) Int. Cl.
*H01L 23/58* (2006.01)
*H01L 21/3065* (2006.01)
*G21K 1/06* (2006.01)
(Continued)

(52) U.S. Cl.
CPC ............ *H01L 21/3065* (2013.01); *B82Y 10/00* (2013.01); *C23F 4/00* (2013.01); *G21K 1/062* (2013.01); *H01L 21/32137* (2013.01); *G21K 2201/067* (2013.01)

(58) Field of Classification Search
USPC .......................... 438/257, 386, 703, 706, 721
See application file for complete search history.

(56) References Cited

U.S. PATENT DOCUMENTS 4,415,653 A * 11/1983 Lai et al. ...................... 430/296
4,931,410 A * 6/1990 Tokunaga et al. ............ 438/618
(Continued)

FOREIGN PATENT DOCUMENTS

EP         0355496 A2    2/1990
WO    WO2011/142782    11/2011

OTHER PUBLICATIONS

International Search Report of International Application PCT/US2012/024704—Date mailed: May 23, 2012, 4 pages.
(Continued)

*Primary Examiner* — Jaehwan Oh
(74) *Attorney, Agent, or Firm* — Dorene M. Price

(57) ABSTRACT

A process is disclosed for sectioning by etching of monolayers and multilayers using an RIE technique with fluorine-based chemistry. In one embodiment, the process uses Reactive Ion Etching (RIE) alone or in combination with Inductively Coupled Plasma (ICP) using fluorine-based chemistry alone and using sufficient power to provide high ion energy to increase the etching rate and to obtain deeper anisotropic etching. In a second embodiment, a process is provided for sectioning of $WSi_2/Si$ multilayers using RIE in combination with ICP using a combination of fluorine-based and chlorine-based chemistries and using RF power and ICP power. According to the second embodiment, a high level of vertical anisotropy is achieved by a ratio of three gases; namely, $CHF_3$, $Cl_2$, and $O_2$ with RF and ICP. Additionally, in conjunction with the second embodiment, a passivation layer can be formed on the surface of the multilayer which aids in anisotropic profile generation.

38 Claims, 14 Drawing Sheets

(51) Int. Cl.
  *H01L 21/3213* (2006.01)
  *C23F 4/00* (2006.01)
  *B82Y 10/00* (2011.01)

(56) References Cited

U.S. PATENT DOCUMENTS

| | | | |
|---|---|---|---|
| 5,358,601 A * | 10/1994 | Cathey | 438/721 |
| 5,442,238 A | 8/1995 | Takata | |
| 6,081,334 A | 6/2000 | Grimbergen et al. | |
| 6,114,182 A * | 9/2000 | Tabara | 438/17 |
| 6,274,419 B1 * | 8/2001 | Omid-Zohoor et al. | 438/218 |
| 6,362,047 B1 * | 3/2002 | Ventajol | 438/257 |
| 6,740,598 B2 | 5/2004 | Kawai et al. | |
| 7,494,891 B2 * | 2/2009 | Cheng et al. | 438/386 |
| 7,563,379 B2 | 7/2009 | Suzuki et al. | |
| 2004/0191937 A1 * | 9/2004 | Patel et al. | 438/21 |
| 2006/0134905 A1 * | 6/2006 | Barwicz et al. | 438/618 |
| 2007/0127110 A1 * | 6/2007 | Pan | 359/298 |
| 2008/0026464 A1 * | 1/2008 | Borenstein et al. | 435/395 |
| 2008/0076230 A1 * | 3/2008 | Cheng et al. | 438/386 |
| 2008/0099450 A1 | 5/2008 | Lewington et al. | |
| 2008/0105649 A1 | 5/2008 | Chandrachood et al. | |
| 2008/0137810 A1 | 6/2008 | Liu et al. | |
| 2008/0197498 A1 * | 8/2008 | Kaushik et al. | 257/754 |
| 2008/0233730 A1 * | 9/2008 | Yu et al. | 438/596 |
| 2009/0111265 A1 | 4/2009 | Min et al. | |
| 2010/0297848 A1 * | 11/2010 | Breitwisch et al. | 438/703 |
| 2011/0193142 A1 * | 8/2011 | Ring et al. | 257/272 |
| 2011/0272380 A1 * | 11/2011 | Jeong et al. | 216/22 |
| 2014/0042628 A1 * | 2/2014 | Edelstein et al. | 257/758 |

OTHER PUBLICATIONS

Written Opinion of the International Searching Authority of International Application, No. PCT/US2012/024704, Date mailed: May 23, 2012, 15 pages.

Aristov, V., et al., "Recent Advances in X-ray Refractive Optics," *Physics-Uspekhi*, vol. 51, No. 1, pp. 57-77, 2008.

Bouet, N., et al., "WSi2/Si Multilayer Sectioning by Reactive Ion Etching for Multilayer Laue Lens Fabrication," *Advances in X-Ray/EUV Optics and Components V, Proceedings of SPIE*, vol. 7802, pp. 78203-1 to 780203-5, 2010, [online] [last accessed Aug. 8, 2013 from: <URL: http://proceedings.spiedigitallibrary.org/proceeding.aspx?articleid=722179 >].

Bouet, N., et al., "Sectioning of $WSi_2$/Si Multilayers by Reactive Ion Etching for Multilayer Laue Lens Fabrication," SPIE Optics & Photonics 2009 Conference, pp. 1-5, (San Diego Aug. 2-6, 2009).

Bouet, N. "From Growth of Multilayers to Multilayer Laue Lenses Nanofabrication," Photon Sciences Seminar, pp. 1-9 (Brookhaven National Laboratory, Mar. 17, 2011).

Buyanova, I. et al., "Photoluminescence Characterization of $SF_6$-$O_2$ Plasma Etching of Silicon," *Materials Science and Engineering*, vol. B36, pp. 100-103, 1996.

Conley, R., et al., "Wedged Multilayer Laue Lens," *Review of Scientific Instruments*, vol. 79, pp. 053104-1 to 053104-4, 2008.

Conley, R., et al., "The NSLS-II Multilayer Laue Lens Deposition System," *SPIE Optics & Photonics 2009 Conference*, pp. 1-5, (San Diego Aug. 2-6, 2009). [online] [last accessed Jul. 24, 2013 from: <URL: http://proceedings.spiedigitallibrary.org/proceeding.aspx?articleid=1341173>].

Conley, R., "The NSLS-II Deposition Laboratory," *10th International Physics of X-ray Multilayer Structures*, pp. 1-4, (Big Sky Resort, Montana, Feb. 14-18, 2010), [online] [last accessed Jul. 24, 2013 from: <URL: http://www.rxolle.com/pxrms/ >].

Conley, R., et al., "Multilayer Growth in the APS Rotary Deposition System," *Advances in X-Ray/EUV Optics and Components II, Proceedings of SPIE*, vol. 6705, pp. 6705050-1 to 670505-7, 2007 [online] [last accessed Jul. 24, 2013 from: <URL:http://proceedings.spiedigitallibrary.org/proceeding.aspx?articleid=819129 >].

De Boer, M., et al., "Guidelines for Etching Silicon MEMS Structures Using Fluorine High-Density Plasmas at Cryogenic Temperatures," *Journal of Microelectromechanical Systems*, vol. 11, No. 4, pp. 385-401, 2002.

Haruhiko, A., et al., "Developments of Plasma Etching Technology for Fabricating Semiconductor Devices," *Japanese Journal of Applied Physics*, vol. 47, No. 3, pp. 1435-1455, 2008.

Khang, H., et al., "Sectioning of Multilayers to Make a Multilayer Laue Lens," *Review of Scientific Instruments*, vol. 78, pp. 046103-1 to 046103-3, 2007.

Kang, H., et al., "Focusing of Hard X-rays to 16 Nanometers with a Multilayer Laue Lens," *Applied Physics Letters*, vol. 92, pp. 221114-1 to 221114-3, 2008.

Kang, H., et al., "Nanometer Linear Focusing of Hard X Rays by a Multilayer Laue Lens," *Physical Review Letters*, Vo. 96, pp. 127401-1 to 127401-4, 2006.

Lee, Y., et al., "Reactive Etching Mechanism of Tungsten Silicide in $CF_4$—$O_2$ Plasma," *Thin Solid Films*, vol. 118, pp. 149-154, 1984.

Maser, J., et al., "Multilayer Laue Lenses as High-Resolution X-Ray Optics," *Design and Microfabrication of Novel X-Ray Optics II, Proceedings of SPIE*, vol. 5539, pp. 185 to 194, 2004 [online] [last accessed Jul. 24, 2013 from: <URL: http://proceedings.spiedigitallibrary.org/proceedings.aspx?articleid=849804>].

PMMA Resists, one page, [online] last accessed Jun. 10, 2011 from: <URL: http://www.microchem.com/products/pmma.htm>].

SU-8 Photoresist Product Line, one page, [online] last accessed Jun. 10, 2011 from: <URL: http://www.microchem.com/products/su_eight.htm>].

Oehrlein, G., et al., "Competitive Reactions of Fluorine and Oxygen with W, $WSi_2$, and Si Surfaces in Reactive Ion Etching Using $CF_4$/$O_2$," *Journal of Vacuum Science Technolgy A*, vol. 7, No. 3, pp. 1035-1041, 1989.

Ranganathan, N., et al., "The Development of a Tapered Silicon Micro-Micromachining Process for 3D Microsystems Packaging," *Journal of Micromechanics and Microengineering*, vol. 18, pp. 1-8, 2008.

Shipley Microposit S1800 Series Photo Resists, pp. 1-6, [online] last accessed Aug. 8, 2013 from: <URL: http://microchem.com/PDFs_Dow/S1800.pdf>].

Tabara, S., et al., "$WSi_2$/Poly-Si Gate Etching Using a TiON Hard Mask," *Japanese Journal of Applied Physics*, vol. 37, pp. 2354-2358, 1998.

Tinck, S., et al., "Investigation of Etching and Deposition Processes of $Cl_2$/$O_2$/Ar Inductively Coupled Plasmas on Silicon by Means of Plasma-Surface Simulations and Experiments," *Journal of Physics D: Applied Physics*, vol. 42, pp. 1-13, 2009.

Wells, T., et al., "Low Temperature Reactive Ion Etching of Silicon with $SF_6$/$O_2$ Plasmas," *Journal of Vacuum Science Technology,B*, vol. 15, No. 2, pp. 434-438, 1997.

\* cited by examiner

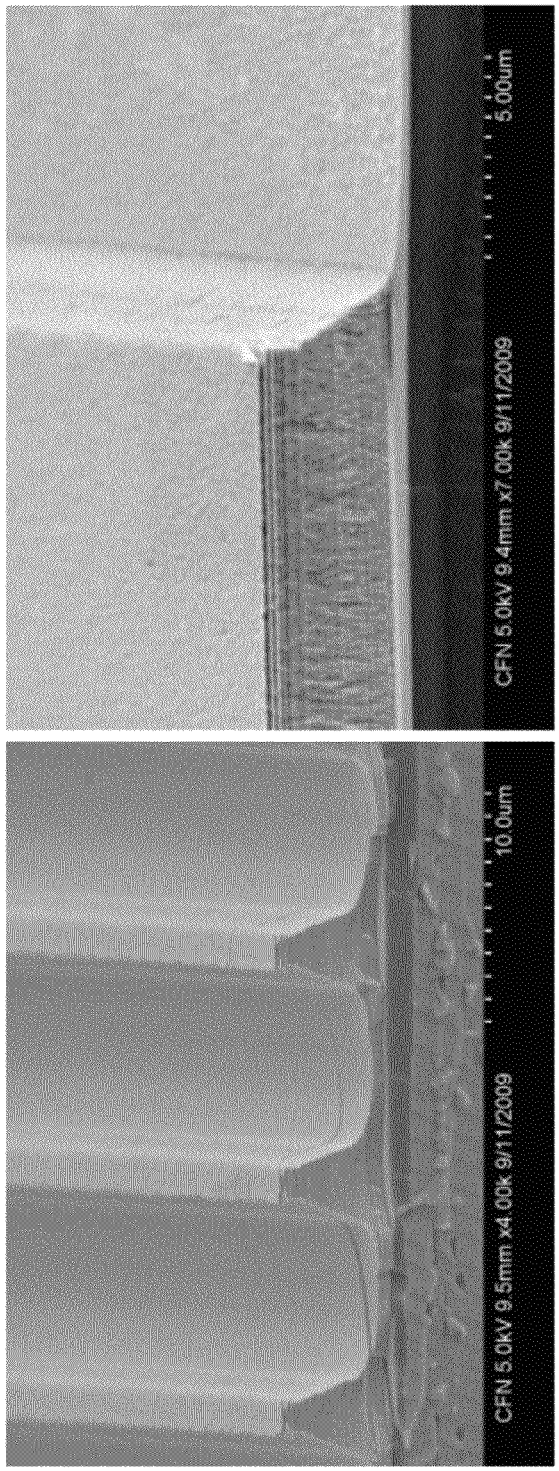
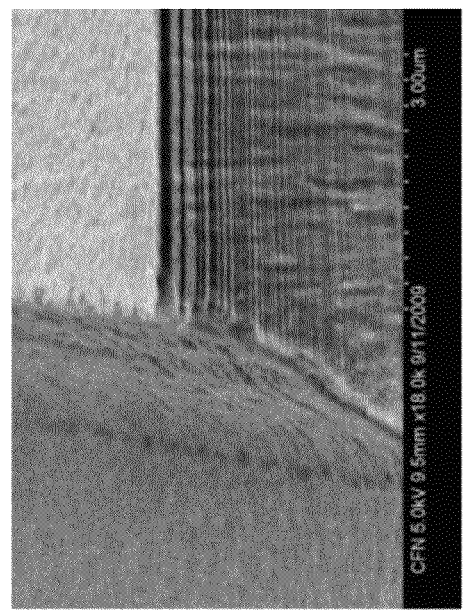
Figure 3A
Figure 3B
Figure 3C

Figure 7D
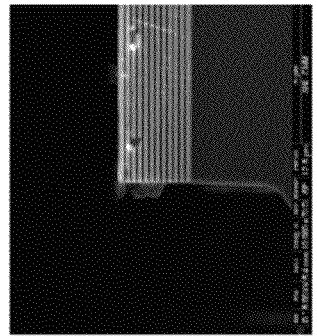
Figure 7G
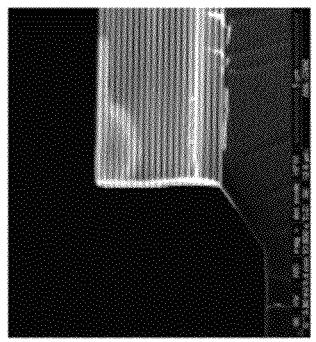
Figure 7C
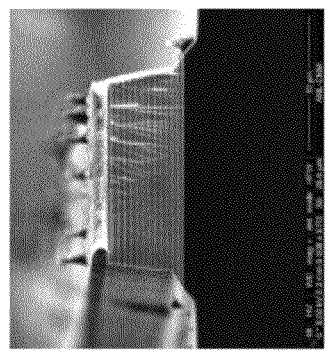
Figure 7F
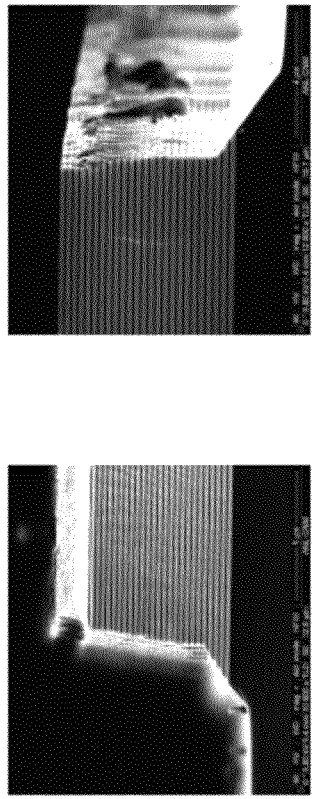
Figure 7B
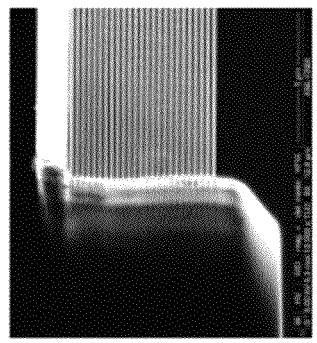
Figure 7E
Figure 7A

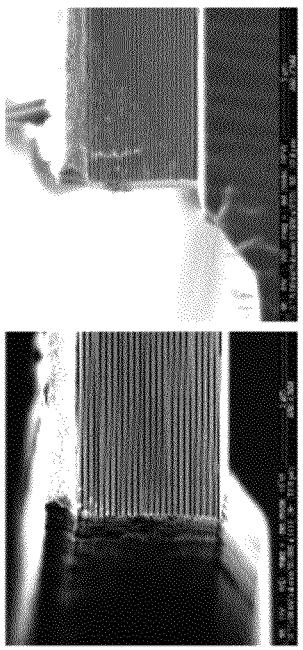
Figure 9A
Figure 9B
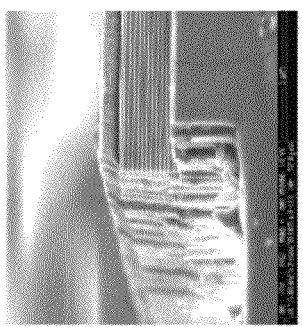
Figure 9C
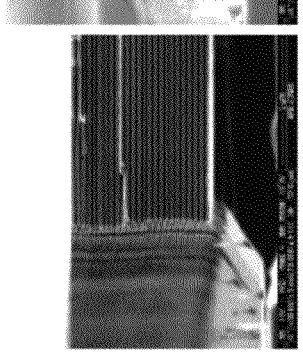
Figure 9D
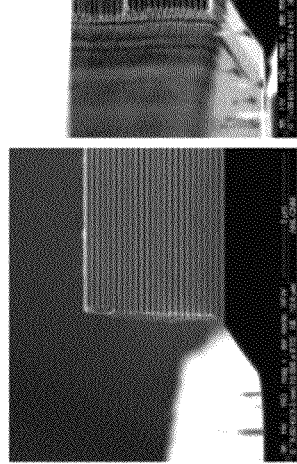
Figure 9E
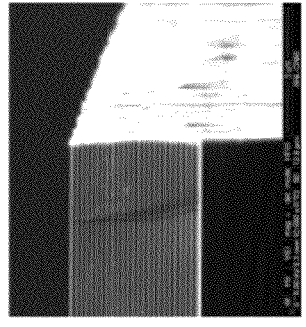
Figure 9F
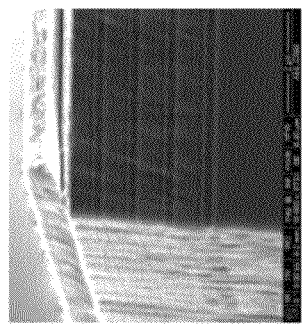
Figure 9G
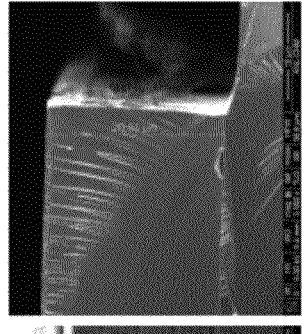
Figure 9H

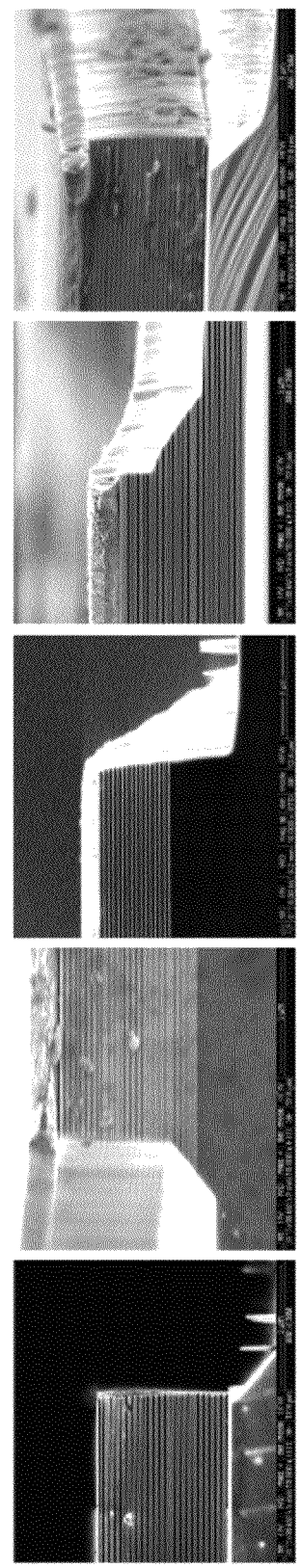

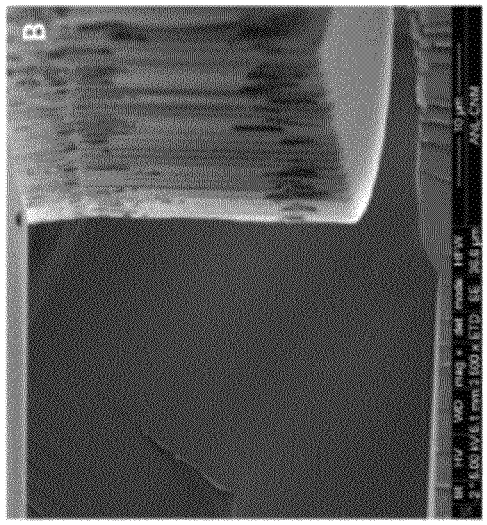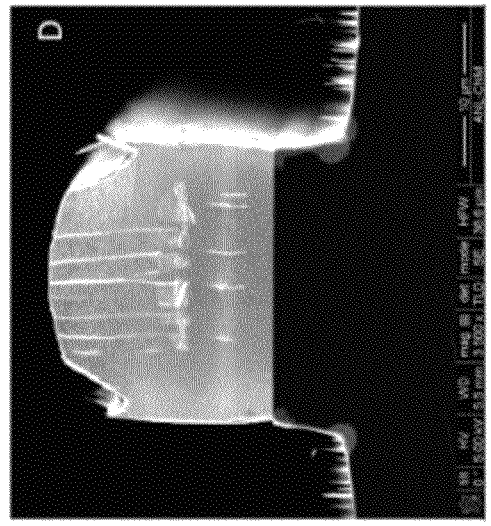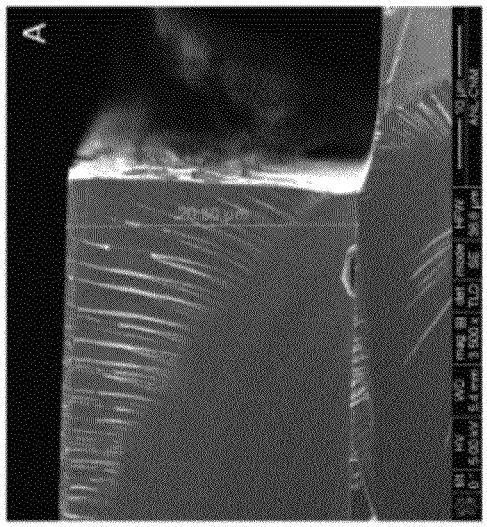
Figure 12

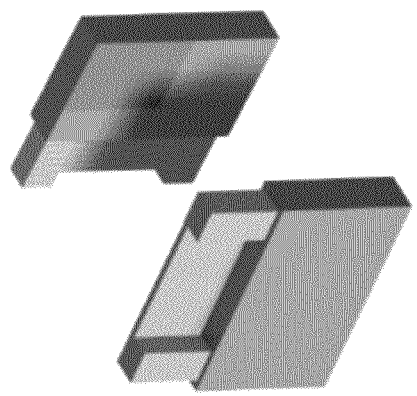
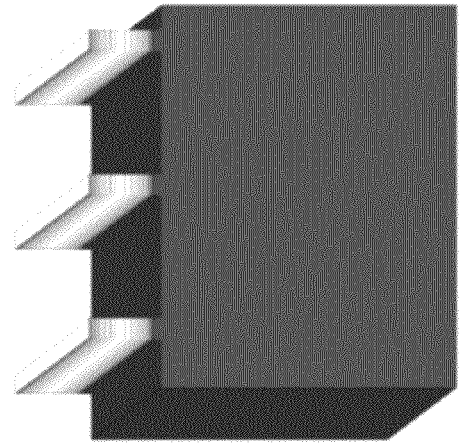
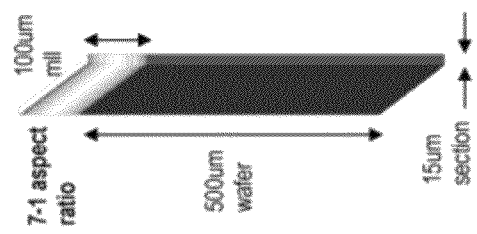
Figure 13

TECHNIQUE FOR ETCHING MONOLAYER AND MULTILAYER MATERIALS

This application claims the benefit of U.S. Provisional Application No. 61/442,040, filed Feb. 11, 2011, entitled "Technique for Etching WSi$_2$ and Si based Materials" and U.S. Provisional Application No. 61/504,013, filed Jul. 1, 2011, entitled "Technique for Etching Monolayer and Multilayer Materials", both of which are hereby incorporated by reference in their entirety.

STATEMENT OF GOVERNMENT LICENSE RIGHTS

The present invention was made with Government support under contract numbers DE-AC-02-98CH10886 and DE-AC02-06CH11357, awarded by the U.S. Department of Energy. The Government has certain rights in the invention.

I. FIELD OF THE INVENTION

This invention relates generally to reactive ion etching for monolayer and multilayer materials. In particular, the present invention relates to a deep etching of monolayer and multilayer materials, such as a WSi$_2$/Si Multilayer Laue Lens (MLL), using reactive ion etching with a combination of fluorine-based and chlorine chemistry.

II. BACKGROUND OF THE RELATED ART

Reactive ion etching (RIE) has been employed in a wide range of fields such as semiconductor fabrication, MEMS (microelectromechanical systems), and refractive x-ray optics with a large investment put towards the development of deep RIE. Due to the intrinsic differing chemistries related to reactivity, ion bombardment, and passivation of materials, the development of recipes for new materials or material systems can require intense effort and resources. For silicon in particular, methods have been developed to provide reliable anisotropic profiles with good dimensional control and high aspect ratios, high etch rates, and excellent material to mask etch selectivity (Ranganathan, N., Lee, D. Y., Ebin, L., Balasubramanian, N., Prasad, K., Pey, K. L., "The development of a tapered silicon micro-micromachining process for 3D microsystems packaging", J. Micromech. Microeng. 18, 115028-1-8 (2008); de Boer, M. J., Gardeniers, J. G. E., Jansen, H. V., Smulders, E., Gilde, M.-J., Roelofs, G., Sasserath, J. N., Elwenspoek, M., "Guidelines for Etching Silicon MEMS Structures Using Fluorine High-Density Plasmas at Cryogenic Temperatures", J. Micromech. Syst. 11 (4), 385-401 (2002); and Wells, T., El-Gomati, M., Wood, J., Johnson, S., "Low temperature reactive ion etching of silicon with SF$_6$/O$_2$ plasmas", 9th Int. Vacuum Microelectronics Conf., 349-353 (1996).

Cl2/O2 chemistry has been studied and developed by the scientific community. See for example, Tabara, S., et al., WSi$_2$/Poly-Si Gate Etching Using a TiON Hard Mask", Jpn. J. Appl. Phys., Vol. 37 (1998), pp. 2354-2358.

A polymerization step has been already been used in different processes to improve anisotropy. However, they are two-step processes or contain multiple successive steps into the process (like in the Bosch process). Multi-step processes are less desirable as the sidewall profile is "scalloped" in most cases.

A multilayer Laue lens is an x-ray focusing optic, which is produced by depositing many layers of two materials with differing electron density in a particular stacking sequence where each layer in the stack satisfies the Fresnel zone plate law (Kang, H. C., Maser, J., Stephenson, G. B., Liu, C., Conley, R., Macrander, A. T., Vogt, S., "Nanometer Linear Focusing of Hard X Rays by a Multilayer Laue Lens", Phys. Rev. Lett. 96, 127401-1-4 (2006)). When this stack is sectioned to allow side-illumination with radiation, the diffracted exiting radiation will constructively interfere at the focal point. Since the first MLLs were developed at Argonne National Laboratory in the USA in 2006 ("Multilayer Laue lenses as high-resolution x-ray optics", J. Maser, G. B. Stephenson, S. Vogt, W. Yun, A. Macrander, H. C. Kang, C. Liu, and R. Conley, Proc. SPIE 5539, pp. 185-194 (2004)), there have been published reports of MLL development efforts in Japan (Koyama, T., Ichimaru, S., Tsuji, T., Takano, H., Kagoshima, Y., Ohchi, T., Takenaka, H., "Optical Properties of MoSi$_2$/Si Multilayer Laue Lens as Nanometer X-ray Focusing Device", Appl. Phys. Express 1, 117003-1-3 (2008)), and, very recently, also in Germany (Liese, T., Radisch, V., Krebs, H-U, "Fabrication of multilayer Laue lenses by a combination of pulsed laser deposition and focused ion beam", Rev. Sci. Instrum. 81, 073710-1-4 (2010)).

The traditional technique for sectioning multilayer Laue lens (MLL) involves mechanical sectioning and polishing, which is labor intensive and can induce delamination or structure damage and thereby reduce yield (Kang, H. C., Stephenson, G. B., Liu, C., Conley, R., Khachatryan, R., Wieczorek, M., Macrander, A. T., Yan, H., Maser, J., Hiller, J., Koritala, R., "Sectioning of multilayers to make a multilayer Laue lens", Rev. Sci. Instr. 78, 046103-1-3 (2007)). If a non-mechanical technique can be used to section MLL, it may be possible to greatly shorten the fabrication cycle, create more usable optics from the same amount of as-grown multilayer, and perhaps develop more advanced structures to provide greater stability or flexibility. Plasma etching of high aspect-ratio multilayer structures may also expand the scope for other types of optics fabrication (such as gratings, zone plates, and so-on). However, well-performing reactive ion etching recipes have been developed for only a small number of materials, and even less recipes exist for concurrent etching of more than one element so a fully material specific process needs to be developed. Further, the techniques are limited with respect to the shapes of the device to be produced, Accordingly, it is an objective to provide sectioning of monolayers and multilayers that overcomes the problems in the art. Another goal is to demonstrate the feasibility of this technique, achievement of a uniform anisotropic etch profile (high quality profile), high anisotropy, adequate sidewall roughness control and high etching rates for thicknesses from the nanometer scale to tens of microns and in any suitably shaped multi-mono-layers.

SUMMARY

The present disclosure provides a process for sectioning by etching of monolayer and multilayer materials using a Reactive Ion Etching (RIE) component with a fluorine-based chemistry component. Specifically, in a first embodiment, the RIE component includes either the RIE technique alone or in combination with Inductively Coupled Plasma (ICP) with the fluorine-based chemistry component; and in a second embodiment, the RIE component includes the RIE technique in combination with Inductively Coupled Plasma (ICP) with a combination of fluorine- and chlorine-based chemistries.

In accordance with the first embodiment, the present disclosure provides a process for etching the monolayer and multilayer materials that are silicide-based or organo-metallic, using the RIE technique alone and a fluorine-based chemistry component containing a gas mixture of $SF_6$ and $O_2$.

Also, in accordance with the first embodiment, the RIE technique can be used in combination with ICP and the fluorine-based chemistry component containing a gas mixture of $SF_6$ and $O_2$. The disclosed process has been found to provide higher etching rates of monolayer and multilayer materials of silicide-based metals with $SF_6$, as compared to traditional $CF_4$, and vertical anisotropy is increased by high fluorine content within the plasma. According to this embodiment, highly anisotropic etching of up to about a 9.0 micron-thick $WSi_2$/Si multilayer can be achieved by using a combined RIE/ICP process with a $SF_6$ and $O_2$ gas mixture (fluorine chemistry alone). Additionally, according to this embodiment, vertical etching can be sustained by the physical etching via ion bombardment for high fluorine content plasmas, while lateral etching is limited by the oxygen reaction with the materials. Furthermore, the sidewalls of the etched structures have adequate surface roughness for use as transmission optics used for example in x-ray focusing when etched with either the $CF_4/O_2$ or $SF_6/O_2$ chemistry.

In a specific implementation of the first embodiment, the process for etching a monolayer material or a multilayer material comprises: (a) obtaining a sample of the monolayer material or the multilayer material to be etched; and (b) performing RIE alone or in combination with ICP etching on the sample using a gas mixture containing $SF_6$ and $O_2$. with radio frequency (RF) power and inductively coupled plasma (ICP) power.

The present disclosure also includes a series of etched tungsten silicide/silicon multilayers comprising sidewalls having adequate surface roughness after being etched by RIE and ICP using a gas mixture of $SF_6$ and $O_2$, where $SF_6$ is about 91% of the gas mixture and $O_2$ is about 9% of the gas mixture.

This process is useful for thin multilayer reflective geometry for soft x-ray grading and etching thin monolayers to produce zone plates. This process is also useful for semiconductor applications.

In accordance with the second embodiment, the present disclosure provides for sectioning by etching of monolayer and multilayer materials using the combined RIE/ICP process with a combination of fluorine-based and chlorine-based chemistries. According to this embodiment, a high level of vertical anisotropy is achieved by a gas mixture of fluorine- and chlorine-based chemistries; namely, $CHF_3$, $Cl_2$, and $O_2$ with radio frequency (RF) power and inductively coupled plasma (ICP) power. According to this embodiment, deeper etching (e.g., over 5 microns, preferably over 8 microns, and more preferably over 20 microns) and straighter sidewalls can be achieved with the disclosed process as compared to traditional etching using $SF_6$ and $CF_4$.

The second embodiment can be used for the same applications as the first embodiment including monolayer and thin multilayer materials. Additionally, the second embodiment can be utilized for the fabrication of thicker multilayer materials, such as a Multilayer Laue Lens (MLL), and for production of a wide variety of nanostructures, allowing higher performance zone plates and gratings. Additionally, the second embodiment is useful for applications requiring thick growth multilayer materials, including hard x-ray zone plates and waveguides.

In a specific implementation of the second embodiment (the combined RIE/ICP with combined fluorine- and chlorine-based chemistries), the process for etching a $WSi_2$/Si multilayer material comprises: (a) obtaining a sample to be etched; (b) limiting the extent of etching by application to the sample of a masking material; and (c) performing reactive ion etching and inductively coupled plasma etching on the sample using a gas mixture containing $CHF_3$, $Cl_2$, and $O_2$ with RF power and ICP power.

Additionally, a passivation layer can be formed on the surface of the monolayer or multilayer material which aids in anisotropic profile generation. Consumption of a masking material such as a nickel hard-mask can be reduced with this second embodiment producing a series of etched tungsten silicide/silicon multilayers comprising sidewalls having a high degree of vertical anisotropy, a surface with adequate surface roughness for transmission optics, and a passivation layer on the surface after being etched. The etching is performed using RF power and ICP power.

These and other objectives will become more apparent from the following description and illustrative embodiments, which are described in detail with reference to the accompanying drawings. Similar elements in each accompanying figure are designated by like reference numbers and, hence, subsequent detailed descriptions thereof may be omitted for brevity.

BRIEF DESCRIPTION OF THE DRAWINGS

FIG. 3A. SEM cross-section micrograph of deep etched WSi2/Si multilayers using the $SF_6/O_2$ chemistry showing the general shape obtained for the feature etched by RIE alone. RF power was 250 W, $SF_6/O_2$ mix at 9% $O_2$ and 91% $SF_6$, pressure of 25 mTorr.

FIG. 3B. SEM cross-section micrograph of deep etched WSi2/Si multilayers using the $SF_6/O_2$ chemistry showing a zoom-in on one of the sidewalls of the etched features in FIG. 3A.

FIG. 3C. SEM cross-section micrograph of deep etched WSi2/Si multilayers using the $SF_6/O_2$ chemistry showing a zoom in on the top layers etched in FIG. 3A, on the vertical part at the top of the etched feature.

FIG. 7A. SEM cross-section micrograph of WSi2/Si multilayers etched for 1 hour using RIE and ICP with RF power and with ICP power according to the second embodiment using 75% $Cl_2$, 2% $O_2$, and 23% $CHF_3$ at a temperature of −50° C.

FIG. 7B. SEM cross-section micrograph of WSi2/Si multilayers etched for 1 hour using RIE and ICP with RF power and with ICP power according to the second embodiment at a temperature of −20° C.

FIG. 7C. SEM cross-section micrograph of WSi2/Si multilayers etched for 1 hour according to the second embodiment using 75% $Cl_2$, 2% $O_2$, and 23% $CHF_3$ at a temperature of 0° C.

FIG. 7D. SEM cross-section micrograph of WSi2/Si multilayers etched for 1 hour using RIE and ICP with RF power and with ICP power according to the second embodiment using 75% $Cl_2$, 2% $O_2$, and 23% $CHF_3$ at a temperature of 20° C. (room temperature).

FIG. 7E. SEM cross-section micrograph of WSi2/Si multilayers etched for 1 hour using RIE and ICP with RF power and with ICP power according to the second embodiment using 75% $Cl_2$, 2% $O_2$, and 23% $CHF_3$ at a temperature of 40° C.

FIG. 7F. SEM cross-section micrograph of WSi2/Si multilayers etched for 1 hour using RIE and ICP with RF power and with ICP power according to the second embodiment using 75% $Cl_2$, 2% $O_2$, and 23% $CHF_3$ at a temperature of −50° C.

FIG. 7G. SEM cross-section micrograph of WSi2/Si multilayers etched for 1 hour 30 minutes using RIE and ICP with RF power and with ICP power according to the second embodiment using 75% $Cl_2$, 2% $O_2$, and 23% $CHF_3$ at a temperature of 20° C.

FIG. 9A. SEM cross-section micrograph of WSi2/Si multilayers etched according to the second embodiment for 1 hour using RIE and ICP with RF power and with ICP power at room temperature with 23% $CHF_3$, 75% $Cl_2$, 2% $O_2$.

FIG. 9B. SEM cross-section micrograph of WSi2/Si multilayers etched for 1 hour with 33% $CHF_3$, 65% $Cl_2$, 2% $O_2$.

FIG. 9C. SEM cross-section micrograph of WSi2/Si multilayers etched for 1 hour with 38% $CHF_3$, 60% $Cl_2$, 2% $O_2$.

FIG. 9D. SEM cross-section micrograph of WSi2/Si multilayers etched for 1 hour with 43% $CHF_3$, 55% $Cl_2$, 2% $O_2$.

FIG. 9E. SEM cross-section micrograph of WSi2/Si multilayers etched for 1 hour with 48% $CHF_3$, 50% $Cl_2$, 2% $O_2$.

FIG. 9F. SEM cross-section micrograph of WSi2/Si multilayers etched for 2 hours with 38% $CHF_3$, 60% $Cl_2$, 2% $O_2$.

FIG. 9G. SEM cross-section micrograph of WSi2/Si multilayers etched for 2 hours 30 minutes with 43% $CHF_3$, 55% $Cl_2$, 2% $O_2$.

FIG. 9H. SEM cross-section micrograph of WSi2/Si multilayers etched for 3 hours with 48% $CHF_3$, 50% $Cl_2$, 2% $O_2$.

FIG. 10A. SEM cross-section micrograph of WSi2/Si multilayers etched according to the second embodiment with 23% $CHF_3$, 75% $Cl_2$, 2% $O_2$ using RIE and ICP with RF at 30 W and with ICP at 350 W for 1 hour.

FIG. 10B. SEM cross-section micrograph of WSi2/Si multilayers etched with 23% $CHF_3$, 75% $Cl_2$, 2% $O_2$ using RF at 50 W and ICP at 350 W for 1 hour.

FIG. 10C. SEM cross-section micrograph of WSi2/Si multilayers etched with 23% $CHF_3$, 75% $Cl_2$, 2% $O_2$ using RF at 100 W and ICP at 350 W for 40 minutes.

FIG. 10D. SEM cross-section micrograph of WSi2/Si multilayers etched with 23% $CHF_3$, 75% $Cl_2$, 2% $O_2$ using RF at 100 W and no ICP for 1 hour 30 minutes.

FIG. 10E. SEM cross-section micrograph of WSi2/Si multilayers etched with 23% $CHF_3$, 75% $Cl_2$, 2% $O_2$ using RF at 250 W and no ICP for 1 hour.

FIG. 12A. SEM cross-section micrograph of an etched WSi2/Si multilayer according to the second embodiment, with 50% $Cl_2$/2% $O_2$/48% $CHF_3$ chemistry, at 10 m Torr Pressure, an applied RF power and an ICP power at room temperature (20° C.).

FIG. 12B. SEM cross-section micrograph of an etched WSi2/Si multilayer according to the second embodiment useful for x-ray focusing, with 65% $Cl_2$/2% $O_2$/33% $CHF_3$ chemistry, at 10 m Torr Pressure, an applied RF power and an ICP power at room temperature (20° C.).

FIG. 12C. SEM cross-section micrograph of an etched WSi2/Si multilayer according to the second embodiment useful for x-ray focusing, with 60% $Cl_2$/2% $O_2$/38% $CHF_3$ chemistry, at 10 m Torr Pressure, an applied RF power and an ICP power at room temperature (20° C.).

FIG. 12D. SEM cross-section micrograph of an etched WSi2/Si multilayer according to the second embodiment, with 75% $Cl_2$/2% $O_2$/23% $CHF_3$ chemistry, at 10 m Torr Pressure, an applied RF power and an ICP power at room temperature (20° C.).

FIG. 13. Schematic representation of possible advanced structures that can be realized through RIE compared to standard polishing technique for transmission multilayer optics.

DETAILED DESCRIPTION

Figures 1A, 1B:
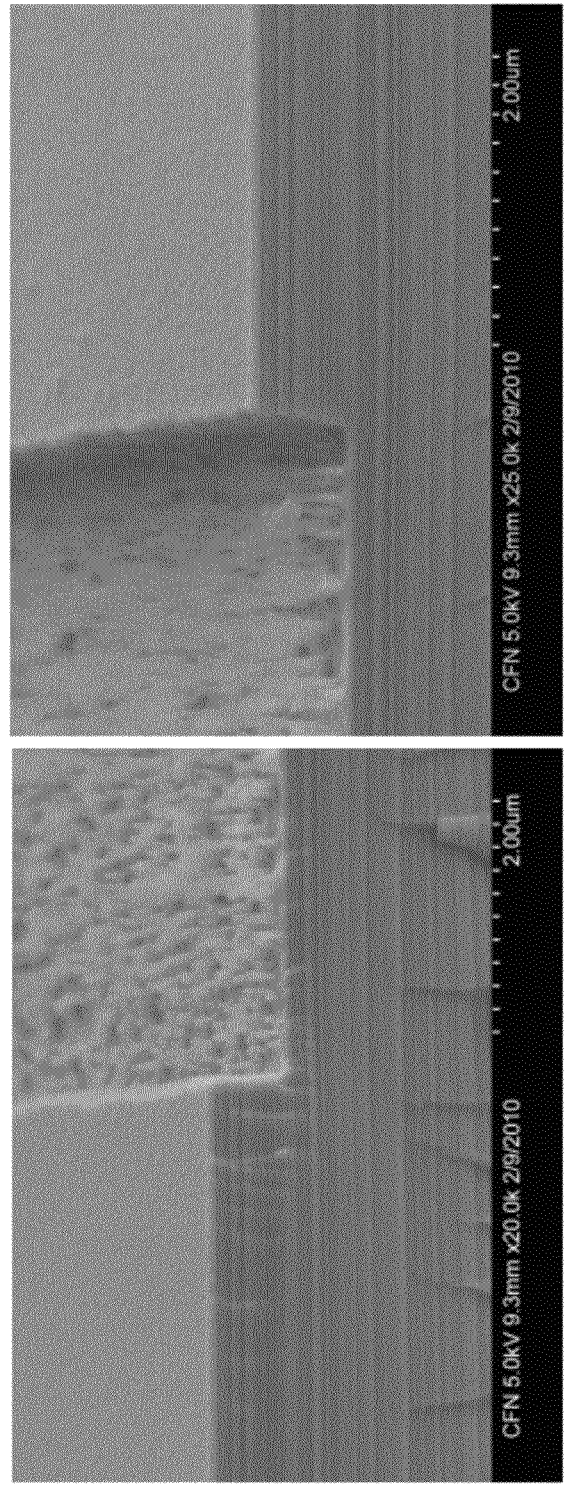
FIG. 1A. SEM cross-section micrograph of etched $WSi_2$/Si multilayers using the prior art $CF_4/O_2$ chemistry. An RF power of 100 W was used for 30 minutes at a sample temperature of 20° C. (room temperature) and an etching rate of 37 nm/min. The sidewall profile is smooth with a profile of 88°±2°, but the bottom of the trenches is very rough (mask attacked and grass).
FIG. 1B. SEM cross-section micrograph of etched $WSi_2$/Si multilayers using the prior art $CF_4/O_2$ chemistry. An RF power of 100 W was used for 30 minutes at a sample temperature of 20° C. (room temperature) and an etching rate of 22.5 nm/min. The sidewall profile is smooth with a profile of 98.3°±3°, but the bottom of the trenches is very rough (grass).

The present disclosure provides a process for patterning and/or sectioning by etching of monolayer and multilayer (ML) materials using a Reactive Ion Etching (RIE) component with a fluorine-based chemistry component (also referred to as a gas mixture, recipe or F-plasma). In general, the present disclosure provides a process for sectioning of monolayers and multilayer materials using Reactive Ion. Etching (RIE) technique alone or in combination with Inductively Coupled Plasma (ICP) with the fluorine-based chemistry component, or a combination of RIE and ICP with the fluorine-based chemistry component that includes a combination of fluorine- and chlorine-based chemistry (also referred to as a gas mixture, recipe or Cl-plasma).

In a first embodiment, the RIE component includes either the RIE technique alone or in combination with Inductively Coupled Plasma (ICP) with the fluorine-based chemistry component; and in a second embodiment, the RIE component includes the RIE technique in combination with Inductively Coupled Plasma (ICP) with a combination of fluorine- and chlorine-based chemistries.

The use of RIE provides a number of advantages in etching monolayer and multilayer materials. For example, RIE can produce high aspect ratios, essentially no mechanical damage, and advanced structures are possible. Additionally, compared to other techniques, RIE can provide more mechanically stable optics, as a result of thicker substrates in comparison with polished samples. The use of RIE provides design flexibility, higher return, and targeted sectioning when combined with lithography. However, when using RIE, one must tailor the recipe of the chemistry to the particular material being etched, which could require a number of runs to be performed.

In a specific implementation of the first embodiment, the process for etching the monolayer or the multilayer material comprises: (a) obtaining a sample of the monolayer or multilayer to be etched; and (b) performing RIE alone on the sample with RF power or in combination with ICP etching with RF power and ICP power on the sample in either case using a gas mixture containing $SF_6$ and $O_2$. Preferably, the monolayer or the multilayer material is a silicide-based or organo-metallic monolayer or multilayer.

In accordance with the first embodiment, the present disclosure provides a process for etching of monolayer and multilayer materials that are silicide-based or organo-metallic, using the RIE technique alone and the fluorine-based chemistry component containing a gas mixture of $SF_6$ and $O_2$ (fluorine chemistry alone). The disclosed process with RIE and fluorine chemistry provides higher etching rates of monolayer and multilayer materials of silicide-based metals with $SF_6$, as compared to traditional $CF_4$, and vertical anisotropy is increased by high fluorine content within the plasma. As an illustration, using fluorine chemistry and RIE only, the etching rate is about 55 nm/min, whereas using traditional $CF_4$ the etching rate is about 37 nm/min.

The process of the first embodiment using the RIE technique alone with the fluorine chemistry alone is useful for thin multilayer reflective geometry for soft x-ray grading and etching thin monolayers to produce zone plates. This process is also useful for semi-conductor applications and other possible microfabrications related to x-ray optics.

The process of the first embodiment can also use ICP combined with RIE to provide high ion energy and plasma density to increase the etching rate and to obtain deeper anisotropic etching. According to this embodiment, highly anisotropic etching of for example, a 6.4-micron-thick $WSi_2$/Si multilayer can be achieved by using a combined RIE/ICP process where the fluorine-based chemistry component is represented by a $SF_6$ and $O_2$ gas mixture. Additionally, according to this embodiment, vertical etching can be sustained by the physical etching via ion bombardment for high fluorine content plasmas, while lateral etching is limited by the oxygen reaction with the materials. Furthermore, the sidewalls of the etched structures have adequate surface roughness for use as transmission optics and in particular, x-ray focusing when etched with the $SF_6$ and $O_2$ gas mixture.

The disclosed process with the combined RIE/ICP process and fluorine chemistry alone provides higher etching rates of monolayer and multilayer materials of for example, silicide-based metals with $SF_6$, as compared to traditional $CF_4$, and vertical anisotropy is increased by high fluorine content within the plasma. With a combined RIE/ICP process and fluorine chemistry alone, the etch rate is about 320 nm/min, whereas using traditional $CF_4$ the etching rate is about 37 nm/min.

In a specific implementation of the first embodiment, the process for etching a silicide-based or organo-metallic monolayer or multilayer material comprises: (a) obtaining a sample of the silicide-based or organo-metallic monolayer or multilayer to be etched; and (b) performing RIE alone with RF power or in combination with ICP etching with RF power and ICP power on the sample using a gas mixture containing $SF_6$ and $O_2$. Preferably, the silicide-based monolayer or multilayer is $WSi_2/Si$.

The present disclosure also includes a series of etched tungsten silicide/silicon multilayers comprising sidewalls having adequate surface roughness after being etched by RIE and ICP using a gas mixture of $SF_6$ and $O_2$, where $SF_6$ is about 91% of the gas mixture and $O_2$ is about 9% of the gas mixture.

In a second embodiment, the present disclosure provides a process for sectioning by etching of monolayer and multilayer materials using RIE in combination with ICP and a combination of fluorine- and chlorine-based chemistry. The fluorine- and chlorine-based chemistry is represented by for example, $CHF_3$, $Cl_2$, and $O_2$; and a high level of vertical anisotropy is achieved by the gas mixture of $CHF_3$, $Cl_2$, and $O_2$ with Radio Frequency (RF) power and ICP power. The process of the second embodiment can use ICP combined with RIE to provide high ion energy and plasma density to increase the etching rate and to obtain deeper anisotropic etching. Additionally with this process, a passivation layer can be formed on the surface of the monolayer or multilayer material which aids in anisotropic profile generation. Consumption of a masking material can be reduced with this second embodiment. According to this embodiment, deeper etching and straighter sidewalls can be achieved with the disclosed process as compared to traditional etching using $SF_6$ and $CF_4$.

The second embodiment can be used for the same applications as the first embodiment. Additionally, the second embodiment can be utilized for the fabrication not only of monolayer and multilayer materials, such as a Multilayer Laue Lens (MLL), but also for production of a wide variety of nanostructures, allowing higher performance zone plates and gratings. Additionally, the second embodiment is useful for applications requiring thick growth multilayer materials (for example up to about 9.0 microns), including hard x-ray zone plates and waveguides. Preferably the multilayer for any other present embodiments is a thick multilayer.

In a specific implementation of the second embodiment, the process for etching a silicide-based or organo-metallic monolayer or multilayer material comprises: (a) obtaining a sample of the silicide-based or organo-metallic monolayer or multilayer material to be etched; (b) performing RIE in combination with ICP etching on the sample using a gas mixture containing $CHF_3$, $Cl_2$, and $O_2$ with RF power and ICP power. Preferably, the silicide-based monolayer or multilayer is $WSi_2/Si$.

In another specific implementation of the second embodiment, the process for etching a silicide-based or organo-metallic monolayer or multilayer material comprises: (a) obtaining a sample to be etched; (b) limiting the extent of etching by application to the sample of a masking material; and (c) performing RIE in combination with ICP etching on the sample using a gas mixture containing $CHF_3$, $Cl_2$, and $O_2$ with RF power and ICP power. Preferably, the silicide-based monolayer or multilayer is $WSi_2/Si$.

The etching process for each embodiment can be monitored and analyzed using a variety of methods. For example, the etching depth can be analyzed by cleaving the samples and analyzing the sidewalls using an electron microscope, such as an Atomic Force Microscope (AFM). The side wall profiles can be further analyzed using standard line drawing software supplied with the AFM. Scanning electron microscopic (SEM) images of the samples (sidewalls of the etched structures) can be used to evaluate roughness for suitability in transmission optics or x-ray focusing.

Specifically, the etched samples can be examined using a step-height profilometer in order to get a sense of the depth of the etch and a rough estimate of the etch profile. Next, AFM can be used to get a better sense of the depth of the etch, and of the cleanliness of the etch features that have been produced. In addition, SEM imaging is conducted to confirm the previous findings regarding the etch profile, basic roughness estimation, and to determine the degree of anisotropy achieved overall for the monolayer or multilayer, as well as for each type of layer.

Monolayer and Multilayer Material

For the first and second embodiments, the monolayer material can be formed from any suitable material such as for example $WSi_2$, $VSi_2$, $MoSi_2$, Si, Mo, Ni, Al2O3, and W.

For the first and second embodiments, the multilayer material can be formed from any suitable material and can be prepared by either RIE alone or RIE in combination with ICP. Additionally, the multilayer material can be any dimension, size, or thickness. Furthermore, the stacking sequence and thickness variation between layers can be regular, pseudorandom, or irregular. Accordingly, the multilayer material can be formed of for example, $WSi_2/Si$, W/Si, $W/B_4C$, W/C, Mo/Si, $MoSi_2/Si$, $Mo/B_4C$, $Ni/B_4C$, $Al_2O_3/B_4C$, $VSi_2/Si$, and/or any combination thereof. In a preferred embodiment, the multilayer material is a regular multilayer Laue lens (MLL) formed of $WSi_2/Si$ (without a zone compensation layer) using the same type of growth conditions as described in International PCT Application No. PCT/US2010/60057 filed Dec. 13, 2010 incorporated herein by reference in its entirety.

For each embodiment, the surface of the monolayer or multilayer material can be protected by a masking material that resists etching. This may be done for example in the case of patterning. The masking material can be any suitable material that is known in the art. In certain embodiments, the masking material is a hard-mask material or photo-resist (e.g., a polymer or an organic material).

Preferably for either the first or the second embodiment, the hard-mask material is nickel or chromium. Preferably, for the second embodiment, the hard-mask material is nickel. The Ni-hard mask has selectivity towards the MLL better than with the Cr-hard mask in the second embodiment using the Cl-plasma (i.e., $CHF_3/Cl_2/O_2$). The higher selectivity of Ni is experienced under the type of plasma with the combined fluorine- and chlorine-based chemistries as compared to the SF6-based one (fluorine chemistry alone). When using the F-plasma (i.e., $SF_6/O_2$) of the first embodiment, preferably the hard-mask material is chromium. The thickness of the mask can be determined by one skilled in the art.

Preferably, the photo-resist is obtained from Shipley, for example Microposit S1800 Series Photo Resists such as Sc1827, S1811, S1813 (polysilicon), S1805 available commercially from MicroChem. Corp., Newton, Mass.; for example, MicroChem SU-8 Photoresist Product Line (epoxy based); and MicroChem PMMA resists (polymethyl methacrylate). The nomenclature for the Microposit S1800 series photoresist is designed so that the last two digits represent the thickness of the photoresist. Accordingly, S1805 is 0.5 microns thick, S1813 is 1.3 microns thick, and so on. The PMMA resists are preferably used in a diluted (less thick) form for very thin mono- or multilayers (e.g., PMMA can be used up to 100 nm ($Cl_2/CHF_3/O_2$). However, when selecting a photoresist as a mask the choice depends on the selectivity between the photoresist and the material to be etched. It is preferable to use a lower thickness for the photoresist as a mask but sufficiently thick to not compromise the integrity of the photoresist as the mask. Typically, if etching a 250 nm multilayer can use for example, S1805 to give sufficient and easier patterning, and better profile. But other photoresists can be used and selected by one skilled in the art. In the present embodiments, S1827 is mostly used (approximately 80% of samples etched).

As an alternative to patterning, for each embodiment the present process for etching can also be used to eliminate Si or $WSi_2$ from the surface of the sample. In which case, a masking material is not utilized. The present processes and present multilayers are able to be prepared in a one-step dry etching (RIE-based) process, with a gas mixture that flows at a steady rate, and the etching does not "pause" for polymerization. The present multilayer sidewalls lack the typical "scalloping" that can be found with multi-step RIE processes.

There are many parameters that can be adjusted to tune the general process of etching depending on the desired result. For example, chemistry (gas mixture), pressure, plasma coupling, plasma power, resist material, and sample temperature are some of the parameters that the can varied. While there are many parameters, the two sections below describe some of the parameters that have been analyzed for the present process and present multilayers with the general goal of having straight walls, optimized etching rate, and best selectivity.

Parameters for the Process of the First Embodiment

The gas mixture, temperature, and pressure involved in the present process are parameters related to the first embodiment. The fluorine-based chemistry component is preferably $SF_6$, and the $SF_6$ content utilized with the process of the first embodiment can be between about 89% to about 93%; preferably between about 90% to about 92%; and most preferably at about 91%.

The oxygen content utilized in the gas mixture of the first embodiment can be between about 7% to about 11%; preferably between about 8% to about 10%; and most preferably at about 9%. For both RIE alone and in combination with ICP, the gas mixture can preferably comprise about 91% $SF_6$ and about 9% $O_2$.

When the ME technique is used alone or in combination with ICP, the RF Power utilized with the process of the first embodiment can be supplied by any appropriate equipment, for example an Oxford PLASMA LAB 100. The Plasmalab 100, available from Oxford Instruments, uses an inductively coupled plasma (ICP) source for the high-speed, anisotropic plasma etching of silicon, polymers and dielectric materials. The system has a demonstrated capability to etch vertical walls in silicon to a depth of 300 um at etch rates of 3 um/min with an aspect ratio (width of feature to etch depth) of 50:1.

The RF power utilized may vary based on the equipment (and the chamber) used; however, typical power ranges are between about 1 W to about 200 W; preferably between about 10 W to about 100 W; more preferably between about 10 W to about 50 W; and most preferably at about 10 W. The parameters will also vary depending on the etch depth. For example, a shallower depth can withstand more variability in the power, whereas a deeper etch is more sensitive and requires a narrower range in the power. For example, at the CFN at BNL the RF power is 250 W at room temperature; and at the CNM at ANL the RF power is 100 W at room temperature. Preferably, the RF power is set to a level sufficient to achieve anisotropic etching.

It is difficult to identify the exact power setting or range of power settings as there is a shift in the RF power between the various etching and deposition tools to get the same etch profile and same etch rate. In order to calibrate between two machines, the same settings for parameters such as recipe, Temperature, Pressure, and ICP power can be held constant while the RF power is varied. As a result of using two Plasmalab 100 machines, namely one at ANL and one at BNL, it was found that RF power at 100 at ANL and RF power at 250 at BNL was the setting for the $SF_6$ recipe (F-plasma).

When the RIE technique is combined with ICP, the ICP Power utilized with the process of the first embodiment can be supplied by any appropriate equipment, for example an Oxford PLASMA LAB 100. The ICP power utilized may vary based on the equipment used; however, typical power ranges are between about 100 W to about 600 W; more preferably between about 200 W to about 500 W; and most preferably at about 350 W. Preferably, the ICP power is set to a level sufficient to achieve anisotropic etching.

The gas pressure utilized with the process of the first embodiment can be between about 5 mTorr and about 50 mTorr; preferably between about 10 mTorr and about 25 mTorr; and more preferably at about 10 mTorr.

The temperature that can be utilized with the process of the first embodiment can be between about 50° C. to about –100° C.; preferably between about 0° C. to about –50° C.; more preferably between about –10° C. to about –40° C.; more preferably between about –20° C. to about –30° C.; and most preferably at about –30° C. Preferably, the process of the first embodiment uses low temperature.

Parameters for the Process of the Second Embodiment

The gas mixture, temperature, and pressure involved in the present process are parameters related to the second embodiment. The preferred gas mixture of the second embodiment comprises $O_2$, with fluorine-based and chlorine-based chemistries (halogen gases). The fluorine-based chemistry is represented by $CHF_3$; and the chlorine-based chemistry is represented by $Cl_2$. The preferred ranges of $O_2$, $CHF_3$, and $Cl_2$ is $Cl_2$ (about 50% to about 76%):$O_2$ (about 2% to about 10%): $CHF_3$ (about 48% to about 22%). The percentages of $O_2$, $CHF_3$, and $Cl_2$ in the gas mixture should add up to 100%. The preferred atomic ratio of the $O_2$, $CHF_3$, and $Cl_2$ is 75% Cl2: 2O %2:23% CHF3. Accordingly, the gas mixture preferably comprises about 23% CHF3, 75% Cl2 and about 2% O2.

The oxygen content utilized in the preferred gas mixture with the process of the second embodiment can be between about 1% to 10% preferably between about 1% to about 5%; and most preferably at about 2.0%.

The $CHF_3$ content utilized in the preferred gas mixture with the process of the second embodiment can be between about 22% to about 48%; preferably between about 22% to about 38%; more preferably between about 22% to about 24%; and most preferably at about 23%.

The $Cl_2$ content utilized in the preferred gas mixture with the process of the second embodiment can be between about 50% to about 76%; preferably between about 62% to about 76%; more preferably between about 74% to about 76%; and most preferably at about 75%.

In $t_h$e second embodiment, the RIE technique and ICP are used together. The RF Power utilized with the process of the second embodiment can be supplied by any appropriate equipment, for example an Oxford PLASMA LAB 100 as described above for the first embodiment. The RF power utilized may vary based on the equipment used as noted above for the first embodiment; however, typical power ranges are between about 1 W to about 200 W; preferably between about 10 W to about 100 W; most preferably between about 10 W to about 50 W. Parameters will vary depending on the etch depth. For example, a shallower depth can withstand more variability in the power, whereas a deeper etch is more sensitive and requires a narrower range in the power.

The ICP Power utilized with the process of the second embodiment can be supplied by any appropriate equipment, for example the abovementioned Oxford PLASMA LAB 100. The ICP power utilized may vary based on the equipment used; however, typical power ranges are between about 100 W to about 500 W; more preferably between about 200 W to about 400 W; and most preferably at about 350 W.

The temperature that can be utilized with the process of the second embodiment can be between about 50° C. to about −50° C.; more preferably 40° C. to about 0° C.; most preferably at about 20° C. to about 25° C. (room temperature).

The gas pressure utilized with the process of the first embodiment can be between about 5 mTorr and about 50 mTorr; preferably between about 10 mTorr and about 25 mTorr; and more preferably at about 10 mTorr.

EXAMPLES

1. Multilayer Substrate Preparation

The multilayers are prepared by DC magnetron sputtering under high vacuum onto Si (100) wafers. Layers are deposited by raster-scanning the substrate over stationary targets with figured apertures at well-defined velocities using a rotary deposition system in the BNL, NSLS-II deposition laboratory using a method that has been previously reported (Conley, R., Liu, C., Kewish, C. M., Macrander, A. T., Morawe, C., "Multilayer growth in the APS rotary deposition system", *Proc. SPIE* 6705, 670505 (2007); Conley, R., et al., "Wedged multilayer Laue lens", *Rev. Sci. Instr.* 79, 053104 (2008); and Kang, H., et al., "Nanometer Linear focusing of Hard X Rays by a Multilayer Laue Lens", *Phys. Rev. Letters* 96, 127401 (2006); each of which is herein incorporated by reference). Sputtering targets with dimensions of 3 inch diameter and 0.25" thick are comprised of boron-doped silicon and hot-pressed $WSi_2$. Initial tests utilize very simple periodic multilayer structures, and the final performance reported here uses a binary pseudorandom stacking sequence with thickness variation between 3 to 100 nm and a total growth thickness of between 1 and 6.4 microns for the first embodiment, or between 1 and 21 microns for the second embodiment.

After multilayer growth, the samples are spin-coated a polymer photo-resist, soft-baked, and then patterned with a photo-mask to generate the desired pattern. In some cases the photo-resist, Shipley Microposit S1800 Series, Microposit S1813 or S1827 Photoresist, is used as the RIE resist; in others a chromium or nickel layer is coated over the multilayers and processed with a wet-etch to act as the RIE hardmask. The hard mask is patterned prior to etching using the same photoresist and procedure as mentioned earlier (mainly S1813 or S1805 depending on the thickness of the layer underneath).

RIE for the process of the first, embodiment was performed at both the Brookhaven National Laboratory (BNL) Center for Functional Nanomaterials (CFN) and Argonne National Laboratory (ANL) Center for Nanoscale Materials (CNM), and all of the RIE for the process of the second embodiment was performed with the Oxford Plasmalab 100 system at the CNM at ANL. The system has a chamber dedicated for RIE and a second chamber for combining RIE and ICP etching. Gas flows were maintained between 0 to 50 standard cubic centimeters per minute (sccm) and the pressure was maintained between 10 to 25 mTorr The system also has a controllable cathode temperature from −110° C. to 400° C.

After RIE, the photo-resist mask was stripped prior to imaging. The etched structures were investigated by surface profilometry using a Dektak 150 (contact stylus surface profiler) to obtain a general indication of the etching uniformity and profiles. Scanning Electron Microscopy (SEM) on the etched samples was performed using the FEI™-SEM Nova NanoLab microscope at the CNM at ANL and the Hitachi S-4800 microscope at the CFN at BNL.

In order to achieve highly anisotropic etching of the materials of interest (Si and $WSi_2$) by RIE, the effects of the gas species mixture (chemistry), sample temperature, gas pressure, plasma power, and mask material were studied.

Example 2

$CF_4/O_2$ Etching (Prior Art)

Initial tests were performed using a $CF_4/O_2$ gas mixture due to reports in the literature which indicate, separately, that this particular gas combination has successfully etched both Si and $WSi_2$ (Oehrlein, G. S., Lindstom, L. J., "Competitive reactions of fluorine and oxygen with W, $WSi_2$, and Si surfaces in reactive ion etching using $CF_4/O_2$", *Journal of Vacuum Science & Technology A: Vacuum, Surfaces, and Films* 7 (3), 1035-1041 (1989); Abe, H., Yoneda, M., Fujiwara, N., "Developments of Plasma Etching Technology for Fabricating Semiconductor Devices", *Jap. J. of Appl. Phys.* 47 (3), 1435-1455 (2008); and Lee, Y. H., Chen, M.-M., Ahn, K. Y., Bright, A. A., "Reactive etching mechanism of tungsten silicide in $CF4-O_2$ plasma", *Thin Solid Films* 118 (2), 149-154 (1984); all of which are herein incorporated by reference). $CF_4$ provides fluorine radicals to perform the chemical etching of both Si and $WSi_2$, and oxygen acts as a passivation agent on the sidewalls, which reduces the lateral etch rate (Buyanova, I. A., Henrya, A., Monemara, B., Lindstromb, J. L., Oehrlein, G. S., "Photoluminescence characterization of $SF_6$—$O_2$ plasma etching of silicon", *Materials Science and Engineering* B36, 100-103 (1996); which is herein incorporated by reference).

Highly anisotropic etching of the multilayer was obtained, as shown in FIG. 1. The anisotropy can be controlled by finding a balance between the physical (ion bombardment) and chemical etching. This balance was achieved by using a gas mixture of 91% $CF_4$/9% $O_2$. An RF power of 100 W was used for 30 minutes at a sample temperature of 20° C.

FIGS. 1A and 1B are SEM cross-section micrographs of etched multilayers using a 91% $CF_4$/9% $O_2$ chemistry and RIE alone. Under these conditions, sidewall profiles were smooth but the bottoms of the trenches were very rough (mask attacked and/or grass). Specifically, in FIG. 1A the profile was 88°±2° and in FIG. 1B the profile was 98°±3°. Additionally, the etch rates varied between 22 nm and 37 nm per minute (FIGS. 1B and 1A, respectively), which was considered to be too slow to reasonably etch $WSi_2$/Si MLLs that are tens of microns thick and useful for transmission optics and specifically x-ray focusing. The multilayers in FIGS. 1A and 1B were etched about 670 nm deep. In addition, the etch selectivity between the multilayer and the photo-resist mask was about 1:1 for all variations of $CF_4/O_2$. Using a chromium hard mask produced better results, but the selectivity was still not adequate (1:2) for etching of thick multilayers, for example, greater than 500 nm for the range of etch rates.

Example 3

$SF_6/O_2$ Etching

A. First Embodiment with RIE Only and Fluorine Chemistry Only

One advantage that $SF_6$ brings over $CF_4$ is that more fluorine radicals are available to react with the multilayer materials. When etching Si only, $SF_6$ has been shown in other studies to realize a faster etching rate when compared to $CF_4$ (Buyanova, I. A., Henrya, A., Monemara, B., Lindströmb, J.

Figure 2B:
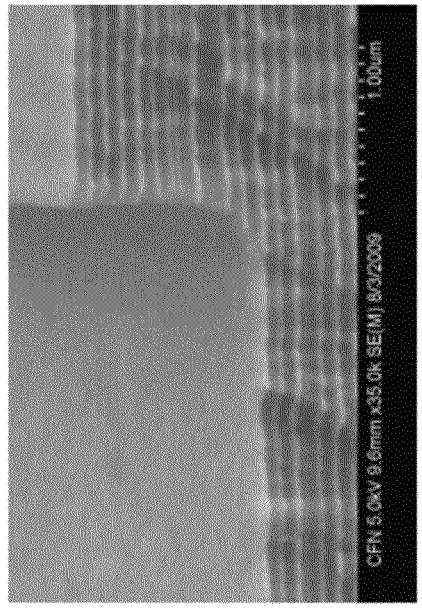
FIG. 2B. SEM cross-section micrograph of WSi2/Si multilayers etched according to the first embodiment by RIE alone at −30° C. using a mixture of 91% $SF_6$/9% $O_2$ at a pressure of 25 mTorr, and an RF power of 250 W at a magnification scale of 1 micron.
Figure 2A:
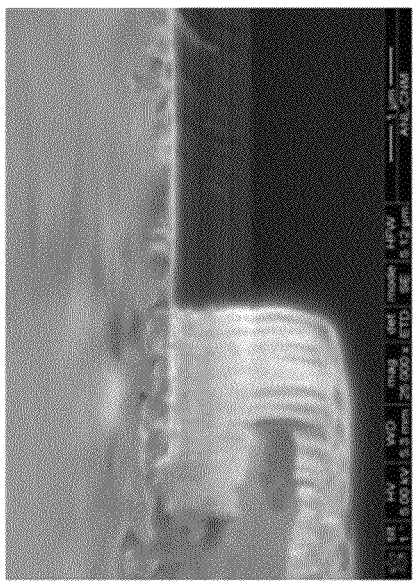
FIG. 2A. SEM cross-section micrograph of $WSi_2$/Si multilayers etched according to the first embodiment by RIE alone at room temperature using a mixture of 91% $SF_6$/9% $O_2$ at a pressure of 25 mTorr, and an RF power of 250 W.
Figure 2C:
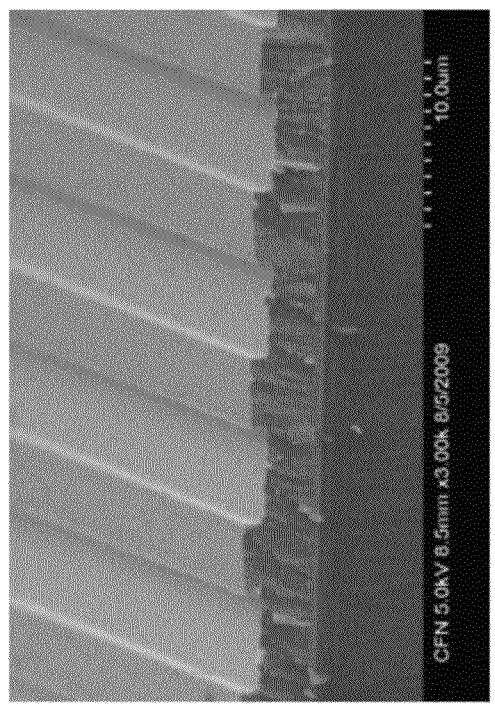
FIG. 2C. SEM cross-section micrograph of etched WSi2/Si multilayers in FIG. 2B at a magnification scale of 10 micron.
Figure 2D:
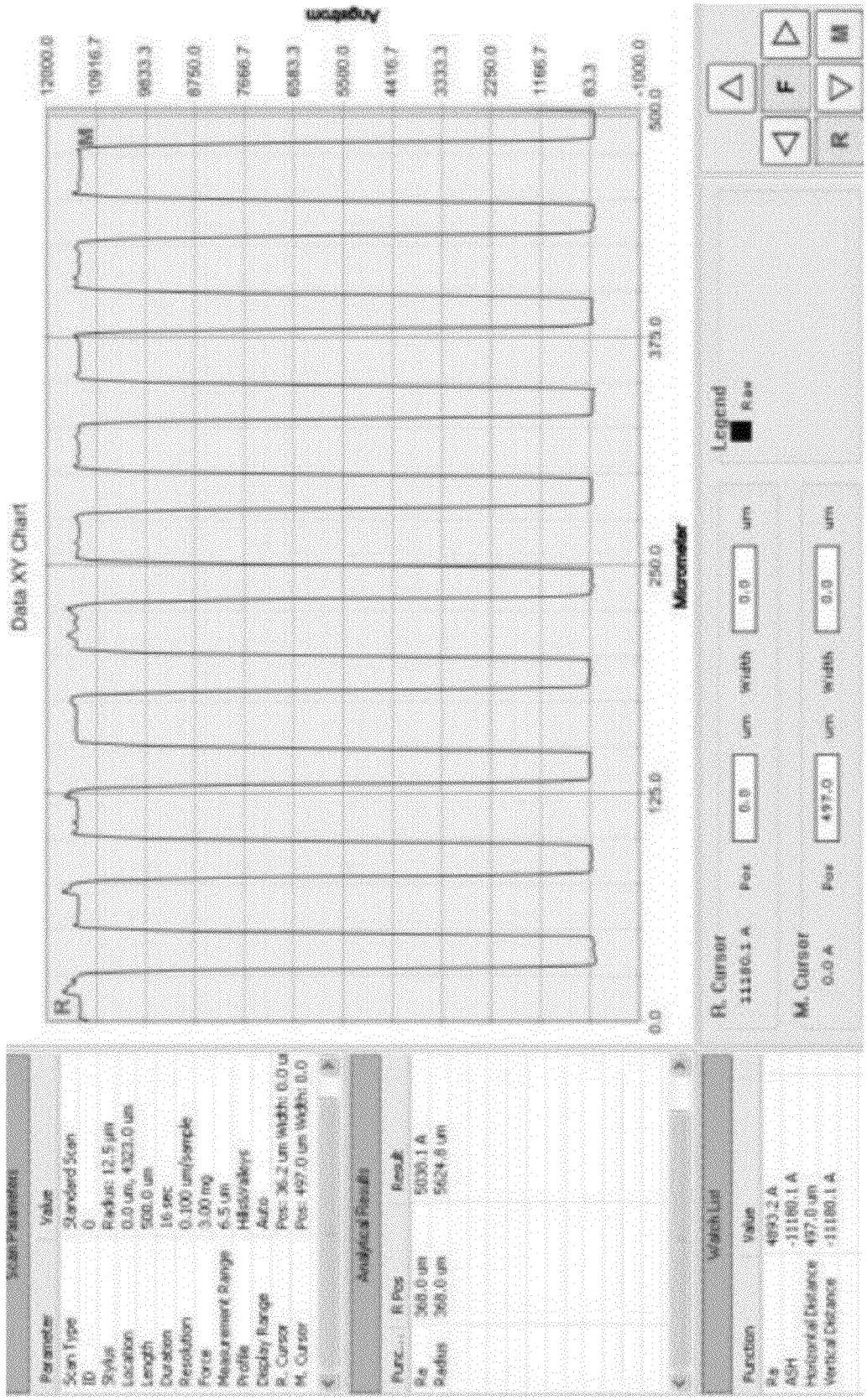
FIG. 2D. Step-height measurement of an etched WSi2/Si multilayer in FIGS. 2B and 2C. The horizontal axis units are mm and the vertical axis units are microns.

L., Oehrlein, G. S., "Photoluminescence characterization of $SF_6$—$O_2$ plasma etching of silicon", *Materials Science and Engineering* B36, 100-103 (1996); which is herein incorporated by reference). The initial experimental conditions used for this gas, $SF_6$, are chosen to be very similar to those employed for the $CF_4/O_2$ chemistry. FIG. 2 illustrates typical cross-section profiles of a multilayer of $WSi_2/Si$ etched by RIE using a mixture of 91% $SF_6$/9% $O_2$ at a pressure of 25 mTorr using an RF power of 250 W at room temperature at the CFN at BNL (FIG. 2C) and at −30° C. (FIG. 2B); RF power of 100 W at room temperature at the CNM at ANL (FIG. 2A). The power setting is adjusted depending on the particular plasma etcher and deposition tool (such as or Plasmalab System 100 available from Oxford Instruments) being used as each instrument varies. The multilayers in FIGS. 2A and 2B are about 1 micron deep.

Under these conditions, sidewall profile anisotropy obtained is about 92°±2° obtained manually from the SEM images. Additionally, the etch rate is enhanced to about 100 nm per minute.

However, when deep etching greater than about 1 micron is attempted, the profile dramatically changes as can be seen in FIG. 3. Specifically, FIG. 3 illustrates SEM cross-section micrographs of etched multilayers by RIE using a 91% $SF_6$/9% $O_2$ chemistry. RF power was 250 W and the pressure was 25 mTorr. FIG. 3A shows the general shape obtained for the feature etched and FIG. 3B is a zoom-in on one of the sidewalls of the etch feature. FIG. 3C is a zoom in on the top layers etched in FIG. 3A, on the vertical part at the top of the etched feature.

One possible explanation for why the profile degrades during the deep etching is that the ions arriving on the sidewall surface no longer have sufficient energy to continue the material etch. The experiments are repeated 3 times with different layer arrangements (thicknesses) and each of the experiments result in the same type of profile with a sudden degradation occurring around the same depth of 1 micron.

B. First Embodiment with Combined RIE/ICP and Fluorine Chemistry Only

Figure 4A:
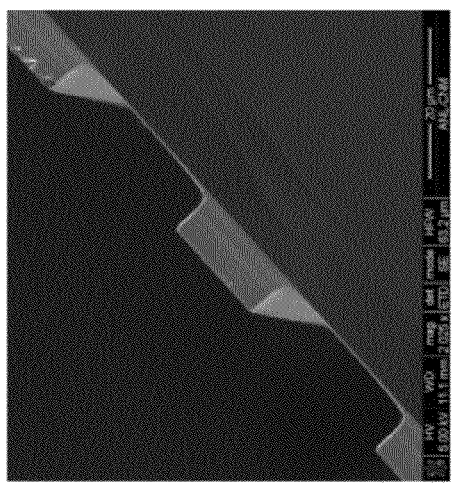
FIG. 4A. Step-height measurement of a 6.4 μm etched WSi2/Si multilayer in FIG. 4B. The horizontal axis units are mm and the vertical axis units are microns.
Figure 4B:
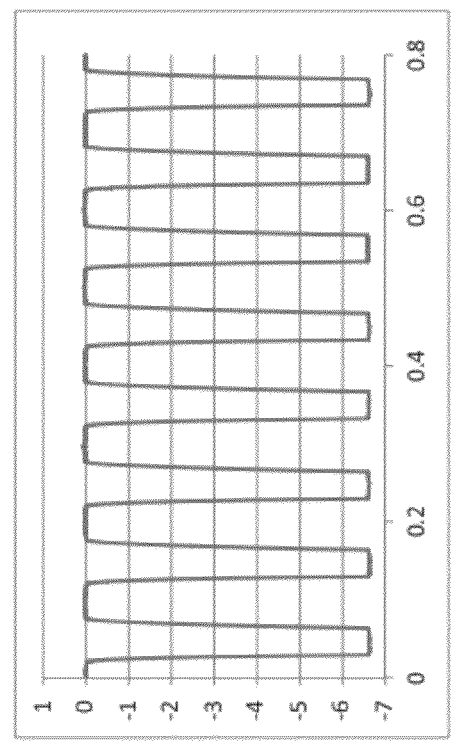
FIG. 4B. SEM cross-section micrograph of a deep (6.4 μm) etched WSi2/Si multilayer according to the first embodiment, using a combination of RIE and ICP with a 91% $SF_6$/9% $O_2$ chemistry at 10 mTorr, an applied RF power of 10 W with an ICP power of 350 W at room temperature (20° C.), and an etching rate of 325 nm/min, showing a highly anisotropic profile (92°±2°) with very smooth sidewalls throughout the entire depth of the multilayer.
Figure 4D:
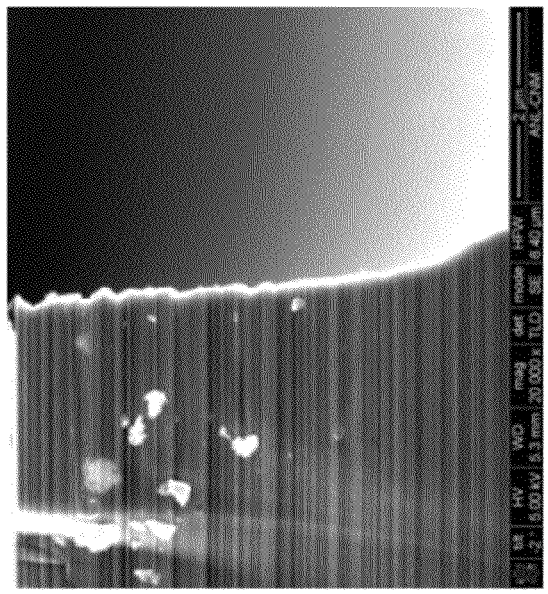
FIG. 4D. SEM cross-section micrograph of a deep (6.4 μm) etched WSi2/Si multilayer showing an even higher resolution image of the sidewall in FIGS. 4B and 4C, illustrating the low roughness obtained in addition to the overall directionality of the etch.
Figure 4C:
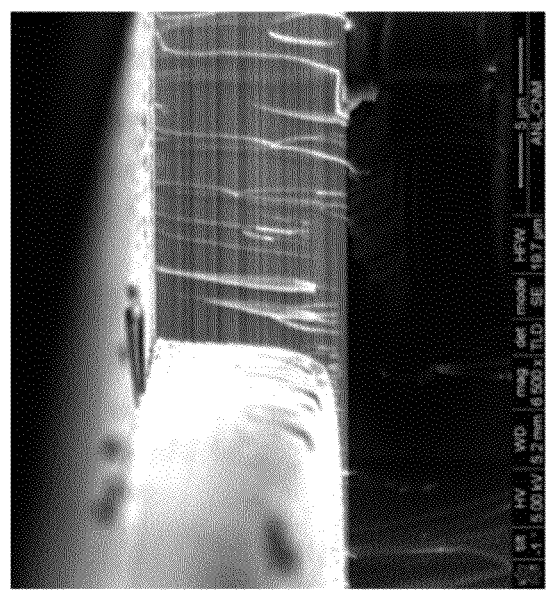
FIG. 4C. SEM cross-section micrograph of a deep (6.4 μm) etched WSi2/Si multilayer showing a zoom in on one of the sidewalls in FIG. 4B of the "steps/sleeve" created through the etching process, showing the high anisotropic etching of the multilayer stack that was achieved.

In order to obtain better sidewall profiles during deep etching, an etch process involving $SF_6/O_2$ and RIE combined with inductively coupled plasma (ICP) is implemented to enhance the ion bombardment of the surface. The best results obtained with this gas mixture were achieved with a 91% $SF_6$/9% $O_2$ chemistry at 10 mTorr and an applied RF power of 10 W with an ICP power of 350 W at room temperature (FIG. 4). FIG. 4 illustrates a step-height measurement (FIG. 4A) and a corresponding SEM cross-section micrograph (FIG. 4B) of a 6.4 μm etched multilayer. FIG. 4B shows a highly anisotropic profile (92°±2°) with very smooth sidewalls was obtained through the entire depth of the multilayer. By increasing the ion energy and plasma density, the etch rate was also enhanced to 325 nm per minute. FIG. 4C shows a zoom in on one of the sidewalls of the "steps/sleeve" created through the etching process, showing the high anisotropic etching of the multilayer stack that was achieved. And, FIG. 4D shows an even higher resolution image of the sidewall, illustrating the low roughness obtained in addition to the overall directionality of the etch.

Sectioning of multilayers consisting of $WSi_2/Si$ using a RIE technique combined with ICP with fluorine-based chemistry was investigated The vertical anisotropy was increased by high fluorine content within the plasma. Higher etching rates were achieved with $SF_6$, as compared to $CF_4$. The use of ICP combined with RIE provided higher ion energy, and thus both a higher etching rate and deeper anisotropic etching were obtained. Sidewalls of the etched structures had adequate surface roughness for use as transmission optics when etched with either the $CF_4/O_2$ or $SF_6/O_2$ chemistry.

Highly anisotropic etching of a 6.4-micron-thick $WSi_2/Si$ multilayer was achieved using a combined RIE/ICP process with a $SF_6/O_2$ gas mixture. Specifically, the most optimal results were obtained using the following conditions: 91% $SF_6$/9% $O_2$ chemistry at 10 mTorr and an applied RF power of 10 W with an ICP power of 350 W at room temperature. Under these conditions, the vertical etching was sustained by the physical etching via ion bombardment for high fluorine content plasmas, while lateral etching was limited by the oxygen reaction with the materials.

The Table below provides a summary of the results (selectivity, roughness, and anisotropy) obtained in the experiments performed for Examples 2 and 3.

TABLE 1

| Mask | Plasma Based | RF/ICP | Selectivity | Roughness | Anisotropy | Temperature |
|---|---|---|---|---|---|---|
| Photo-Resist | $CF_4/O_2$ | RF + ICP | <1:1 | + | + | RT |
| Photo-Resist | $SF_6/O_2$ | RF | 1:3.5 | + | −− | RT |
| Photo-Resist | $SF_6/O_2$ | RF | 1:3.5 | + | +→−− | −30° C. |
| Cr-hard | $SF_6/O_2$ | RF | >1:6 | − | ++ | −100° C. |
| Photo-Resist | $SF_6/O_2$ | RF + ICP | 1:2.5 | + | ++ | RT |

Example 4

$CHF_3/O_2/Cl_2$ Etching (Second Embodiment)

The multilayers were prepared according to the protocol described above in Example 1 After the multilayer growth, a nickel hard-mask was deposited on the samples using DC magnetron sputtering with a thickness of about 10% to 20% of the total multilayer stack thickness. The samples were then spin-coated with a polymer photo-resist, Shipley MICROPOSIT S1800 Series, MICROPOSIT S1813 Photoresist, soft-baked, and then patterned with a photo-mask to the appropriate pattern. After photo-resist development, the nickel hard-mask was wet-etched using Transene Nickel TFB etchant. All of the RIE was performed with an Oxford Plasmalab 100 system at the Center for Nanoscale Materials (CNM) at ANL. The system has one chamber dedicated for RIE and a second chamber for combining RIE and ICP. The reactive gases used in this process were a mixture of $CHF_3$ and $Cl_2$ with the make-up (remainder) quantity of oxygen. Gas flows were maintained between 50 to 66 sccm and the process-gas pressure was held at a constant 10 mTorr. The system has a temperature control on the cathode with a range of −110° C. to 400° C. After RIE, the samples were hand-cleaved to cut the sample in the opposite direction of (perpendicular to) the ML step that was grown in order to expose the etching profiles during imaging and analysis. Scanning Electron Microscopy (SEM) on the etched samples was performed at the CNM.

A. Passivation Layer

Achievement of orthogonal etching profiles with straight sidewalls was enabled by the continuous formation of a passivation layer on the entire exposed multilayer surface which was simultaneously etched by the combination of ion bombardment and chemically-reactive species. The etch rate was much faster on the bottom surface than on the sidewalls due to plasma directionality, therefore the passivation layer on the bottom of the trench was etched away much faster than it was formed. Polymerization is believed to occur between the $CHF_3$ and $O_2$. A protective polymer layer on the etched surfaces may be generated and anisotropic etching can be achieved. An optimized gas mixture was found to include 23% $CHF_3$, 75% $Cl_2$, and 2% $O_2$. An oxygen concentration greater than 2% altered the selectivity where the $WSi_2$ was etched faster than Si as shown in FIG. 5B.

Figures 5A, 5B:
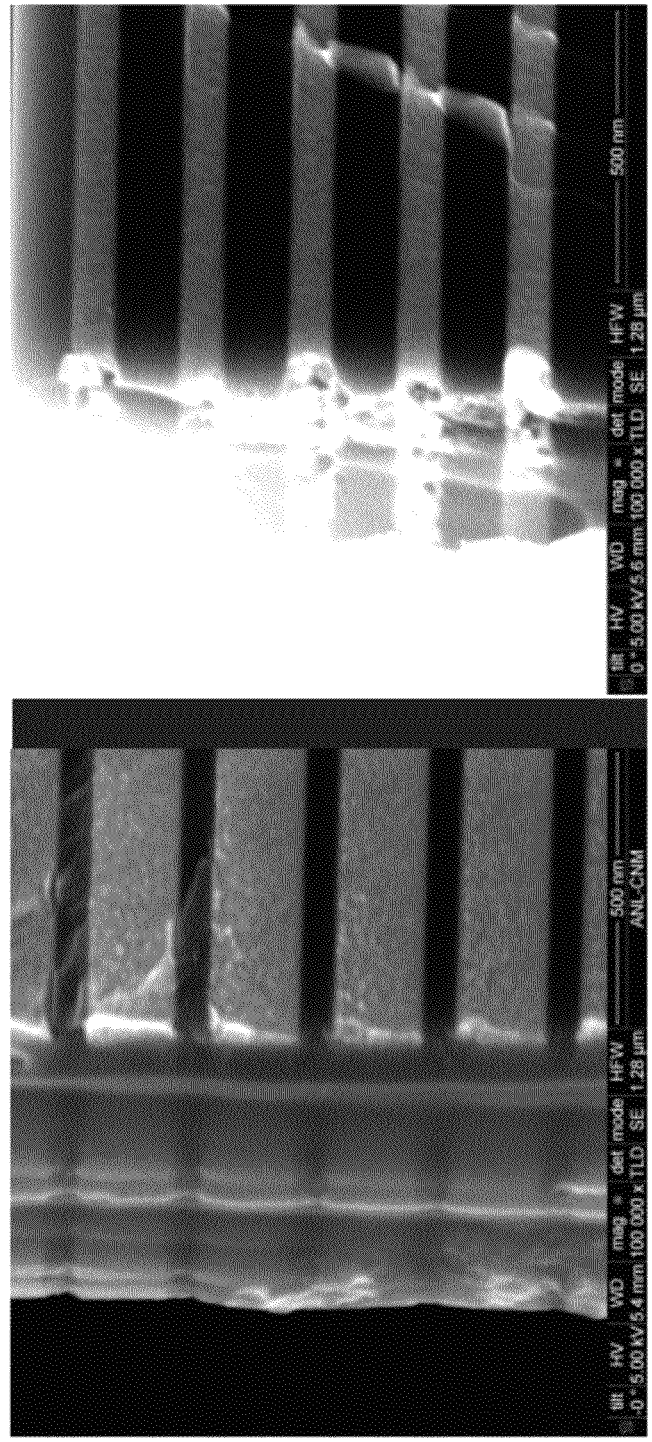
FIG. 5A. SEM cross-section micrograph showing evidence of a passivation layer formed by the second embodiment, using a combination of RIE and ICP with a 23% $CHF_3$/75% $Cl_2$/2% $O_2$ chemistry at 10 mTorr, an applied RF power of 50 W, an ICP power of 500 W at room temperature, 100 nm/min etching rate.
FIG. 5B. SEM cross-section micrograph showing $WSi_2$/Si etch rate increase to approximately 125 nm/min due to too much oxygen (9%)-15% $CHF_3$/9% $O_2$/76% $Cl_2$ etching using a combination of RIE and ICP at 10 mTorr, an applied RF power of 50 W, an ICP power of 350 W, at room temperature.

Specifically, the left portion of FIG. 5A illustrates the passivation layer when the multilayer was etched with about a gas mixture of 23% $CH_3$, 75% $Cl_2$, and 2% $O_2$, RF power of about 50 W, ICP power of about 500 W, pressure of about 10 mTorr, temperature of about 20° C., and etching time of about 30 minutes. In comparison, FIG. 5B illustrates $WSi_2$ etch rate increase due to too much oxygen (9%). The sample was etched under a plasma (gas mixture) of about 16% $CHF_3$, 9% $O_2$, 75% $Cl_2$. RF power of about 50 W, ICP power of about 350 W, Pressure of about 10 mTorr, temperature of about 20° C. and etching time of about 30 minutes.

B. Varying $CHF_3/O_2/Cl_2$ Gas Mixture

The concentration of fluorine and chlorine chemistry represented by a triplet of gases ($CHF_3/O_2/Cl_2$) was varied in order to determine a certain ratio that would provide an etched multilayer with high selectivity between the hard-mask and the multilayer material system, straight sidewalls, and low sidewall roughness. Additionally, the substrate temperature and ICP and RF powers were varied to determine a certain ratio that would provide etched multilayers with both straight sidewalls and minimal sidewall roughness.

Figure 6C:
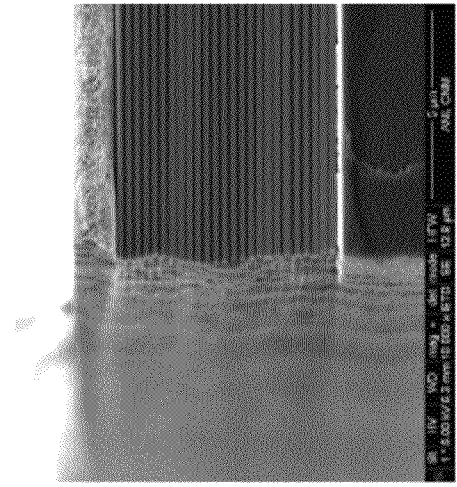
FIG. 6C. SEM cross-section micrograph of WSi2/Si multilayers etched for 1 hour using RIE and ICP with RF power and with ICP power at 700 W, at room temperature, and at 10 mTorr using 75% $Cl_2$, 2% $O_2$, and 23% $CHF_3$ showing high sidewall roughness.
Figure 6B:
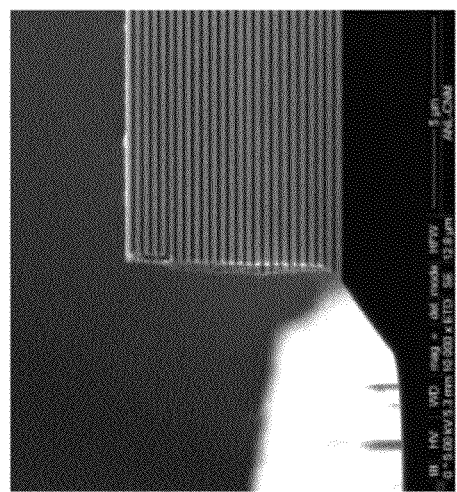
FIG. 6B. SEM cross-section micrograph of WSi2/Si multilayers etched for 1 hour using RIE and ICP with RF power 50 W and with ICP power at 350 W, at room temperature, and at 10 mTorr using 75% $Cl_2$, 2% $O_2$, and 23% $CHF_3$ showing the proper profile according to the second embodiment.
Figure 6A:
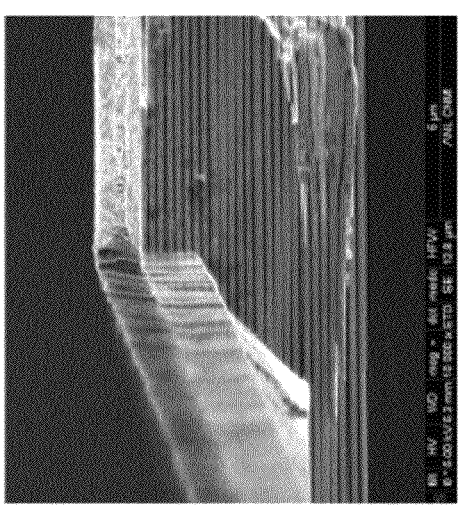
FIG. 6A. SEM cross-section micrograph of WSi2/Si multilayers etched for 1 hour using RIE and ICP with ICP power at 200 W, RF power at 50 W, at 10 mTorr, at room temperature using 75% $Cl_2$, 2% $O_2$, and 23% $CHF_3$ showing poor sidewall profile.
Figure 6E:
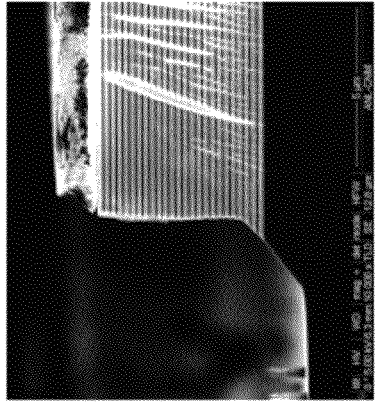
FIG. 6E. SEM cross-section micrograph of WSi2/Si multilayers etched for 30 minutes using RIE and ICP with RF power and with ICP power at 700 W for 30 minutes, at room temperature, and at 10 mTorr using 75% $Cl_2$, 2% $O_2$, and 23% $CHF_3$ showing poor sidewall profile and roughness.
Figure 6D:
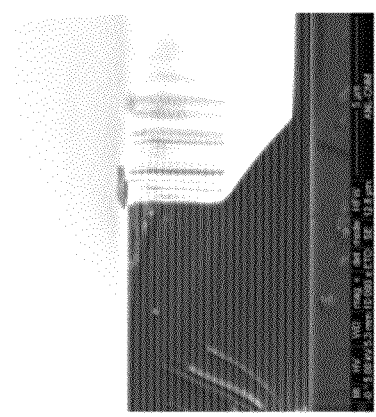
FIG. 6D. SEM cross-section micrograph of WSi2/Si multilayers etched for 30 minutes using RIE and ICP with RF power and with ICP power at 500 W for 30 minutes, at room temperature, and at 10 mTorr using 75% $Cl_2$, 2% $O_2$, and 23% $CHF_3$ a quite good sidewall profile.

In order to determine the ICP power that would provide etched multilayers with acceptable sidewalls, the ICP power was varied between about 200 and 700 W for different times while maintaining a gas mixture of 75% $Cl_2$, 2% $O_2$, and 23% $CHF_3$. FIG. 6 illustrates SEM cross-section micrographs of multilayers etched with different ICP powers. Specifically, FIG. 6A illustrates a multilayer that was etched for 1 hour at 200 W, which resulted in a poor sidewall profile. The sample in FIG. 6A is estimated to be 1.4 microns vertical anisotropically etched monolayer with angle vertical etch of about 4.2 microns. FIG. 6B illustrates a multilayer etched for 1 hour at 350 W, which resulted in a desired profile. The sample in FIG. 6B is estimated to be 5.2 microns vertically etched. FIG. 6C illustrates a multilayer etched for 1 hour at 700 W, which resulted in high sidewall roughness. FIG. 6D illustrates a multilayer etched at 500 W for 30 minutes, which resulted in a quite good profile. The sample in FIG. 6D is estimated to be about 3.0 microns vertically etched and 5.25 microns total etch. Finally, FIG. 6E illustrates a multilayer etched at 700 W for 30 minutes, which resulted in a poor sidewall profile and roughness.

Additionally, the effect of substrate temperature was analyzed and found to exhibit an influence on anisotropy. FIG. 7 illustrates SEM cross-section micrographs of etched multilayers at five different temperatures. These multilayers were etched using a gas mixture of 75% $Cl_2$, 2% $O_2$, and 23% $CHF_3$. Specifically, FIGS. 7A and 7F are cross-section micrographs of multilayers etched for 1 hour at −50° C. and FIG. 7B is a cross-section micrograph of a multilayer etched for 1 hour at −20° C. The sample in FIG. 7B is estimated to be 5.2 microns vertically etched. The cryogenic etching resulted in sloped walls; perhaps due to a decrease in reactivity. Temperatures near ambient were found to produce near orthogonal sidewalls. FIG. 7 shows cross-section micrographs of multilayers etched for 1 hour at 0° C. (FIG. 7C), 1 hour at 20° C. (FIG. 7D, 92.4° angular measurement), and 1 hour 30 minutes at 20° C. (FIG. 7G, 90.3° angular measurement). Further, sidewall profile anisotropy of about 92°±2° was obtained at 20° C. and the etch rate was enhanced to 100 nm per minute (see FIG. 7D). The sample in FIG. 7D is estimated to be 4.4 microns vertically etched and 6.6 microns total etch. Further still, FIG. 7G demonstrates that the second embodiment is able to etch straight into the Si wafer, and therefore, this technique can be, used potentially for the preparation of devices as they are often based on or use Si wafers as a support.

Finally, temperatures above ambient temperature produced structures with an hourglass profile. This result can be seen in FIG. 7E, which illustrates a cross-section micrograph of a multilayer etched for 1 hour at 40° C.

Figure 8A:
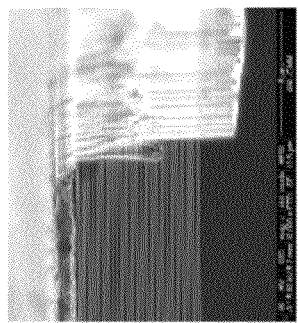
FIG. 8A. SEM cross-section micrograph of WSi2/Si multilayers etched according to the second embodiment for 1 hour using RIE and ICP with RF power and with ICP power with 25% $CHF_3$, 75% $Cl_2$, 0% $O_2$.
Figure 8B:
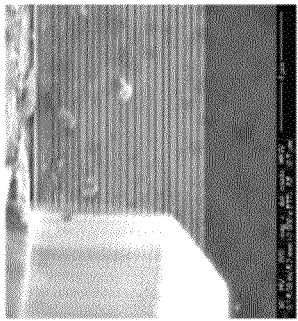
FIG. 8B. SEM cross-section micrograph of WSi2/Si multilayers etched for 1 hour using RIE and ICP with RF power and with ICP power with 23% $CHF_3$, 2% $O_2$, 75% $Cl_2$.
Figure 8C:
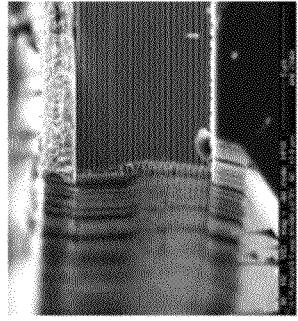
FIG. 8C. SEM cross-section micrograph of WSi2/Si multilayers etched for 1 hour using RIE and ICP with RF power and with ICP power with 20% $CHF_3$, 75% $Cl_2$, 5% $O_2$.
Figure 8D:
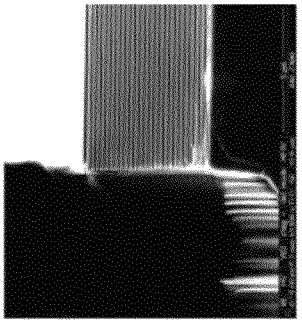
FIG. 8D. SEM cross-section micrograph of WSi2/Si multilayers etched for 1 hour using RIE and ICP with RF power and with ICP power with 15% $CHF_3$, 75% $Cl_2$, 10% $O_2$.
Figure 8E:
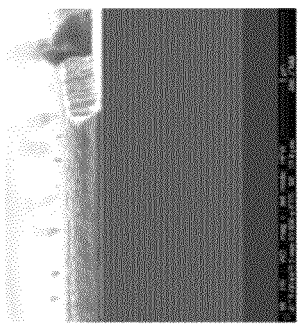
FIG. 8E. SEM cross-section micrograph of WSi2/Si multilayers etched for 1 hour using RIE and ICP with RF power and with ICP power with 0% $CHF_3$, 75% $Cl_2$, 25% $O_2$.
Figure 8F:
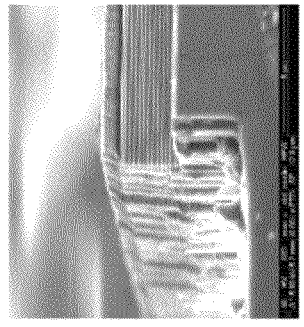
FIG. 8F. SEM cross-section micrograph of WSi2/Si multilayers etched for 1 hour using RIE and ICP with RF power and with ICP power with 38% $CHF_3$, 60% $Cl_2$, 2% $O_2$.
Figure 8G:
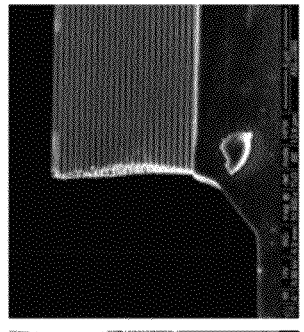
FIG. 8G. SEM cross-section micrograph of WSi2/Si multilayers etched for 1 hour using RIE and ICP with RF power and with ICP power with 35% $CHF_3$, 60% $Cl_2$, 5% $O_2$.
Figure 8H:
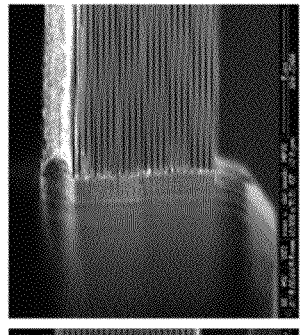
FIG. 8H. SEM cross-section micrograph of WSi2/Si multilayers etched for 1 hour using RIE and ICP with RF power and with ICP power with 30% $CHF_3$, 60% $Cl_2$, 10% $O_2$.
Figure 8I:
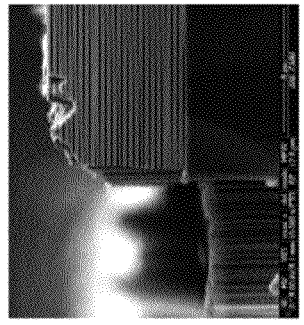
FIG. 8I. SEM cross-section micrograph of WSi2/Si multilayers etched for 1 hour using RIE and ICP with RF power and with ICP power with 15% $CHF_3$, 60% $Cl_2$, 25% $O_2$.

The effect of $CHF_3$ and $O_2$ concentrations in combination with $Cl_2$ were studied to determine the certain ratio of these gases that would provide the desired results. The concentrations of $CHF_3$ and $O_2$ gases were varied while maintaining the concentration of $Cl_2$ at either about 60% or about 75%. All of the experiments were performed for 1 hour. In particular, the concentrations of $O_2$ was varied between 0% to 25% while maintaining the $Cl_2$ concentration at either 75% (FIGS. 8A to 8E) or 60% (FIGS. 8F to 8I), and $CHF_3$ was adjusted accordingly to make 100% gas mixture. It is clear from the FIGS. 8A to 8I that a higher oxygen ratio quickly etches the hard-mask and thus limits the ability to deep etch. According to the results shown in FIG. 8B, the multilayers with the best sidewall profile was obtained using a gas mixture of 23% $CHF_3$, 75% $Cl_2$, and 2% $O_2$. The sample in FIG. 8B is estimated to be 4.4 microns for the vertical etch and 6.6 microns for the total etch. The results shown in FIGS. 8C to 8I were not considered useful for transmission optics. Additionally, the effect of $CHF_3$ and $Cl_2$ concentrations were studied to determine the certain ratio of these gases that would provide the desired results. The concentrations of these gases were varied while maintaining the $O_2$ concentration at the preferred concentration of 2% (FIG. 9). In particular, the concentration of $CHF_3$ was varied from 23% to 48%, while the concentration of $Cl_2$ was varied from 75% to 50%, respectively. According to the results shown in FIG. 9A, a gas mixture of about 23% $CHF_3$, 75% $Cl_2$, and 2% $O_2$ at an etching temperature of about −20° C. provided the best sidewall profile anisotropy. The results shown in FIGS. 9C to 9H were considered to be desirable, while results in 9H were considered not to be useful for transmission optics.

Finally, the effect of RF power was studied using a gas mixture of a gas mixture of 23% $CHF_3$, 75% $Cl_2$, and 2% $O_2$ (FIG. 10). Specifically, the RF power was analyzed at 30 W, 50 W, and 100 W while maintaining the ICP power at 350 W (FIGS. 10A-10C). Each of these images demonstrate that desired sidewall profiles were obtained using an RF power at 30 W (FIG. 10A) and 50 W (FIG. 10B); however, at 100 W the sidewall was sloped (FIG. 10C). Additionally, the effect of performing the etching using RF power of either 100 W or 250 W without any ICP power (ICP at 0 W) resulted in poor sidewall profiles (FIGS. 10D and 10E).

Figure 11A:
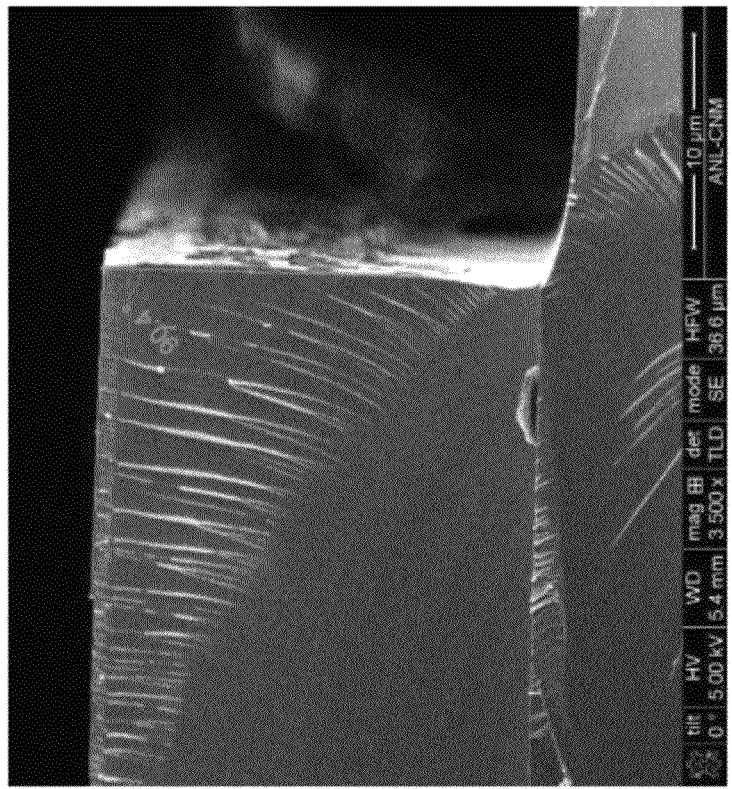
FIG. 11A. SEM cross-section micrograph of $WSi_2$/Si multilayers etched with 38% $CHF_3$, 2% $O_2$, and 60% $Cl_2$ for 2 hours according to the second embodiment showing a pillar exhibiting straight sidewalls.
Figure 11B:
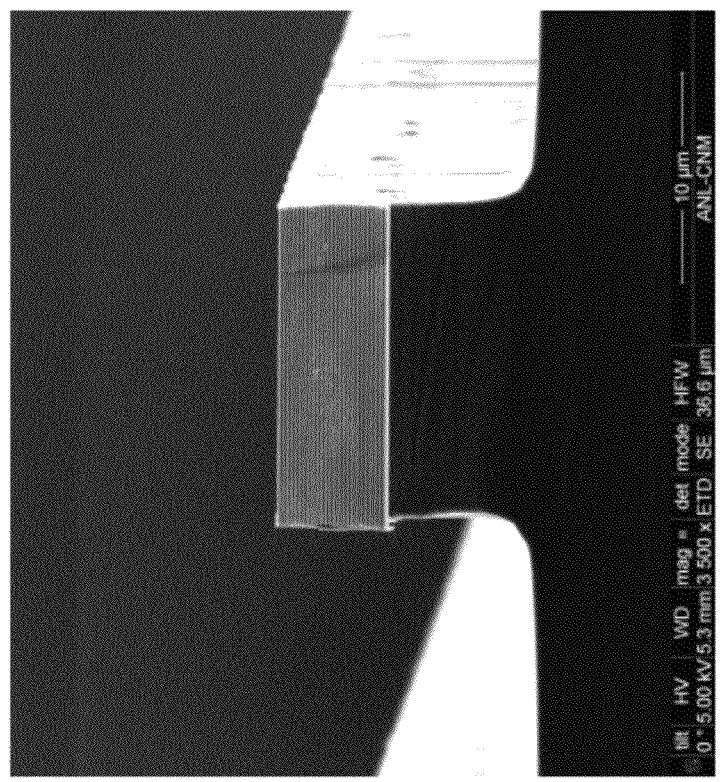
FIG. 11B. SEM cross-section micrograph of $WSi_2$/Si multilayers etched with 48% $CHF_3$, 2% $O_2$, and 50% $Cl_2$ for 3 hours according to the second embodiment showing a pillar exhibiting a 21 μm deep trench.

The sidewall profile of multilayers etched under the desired conditions was analyzed. Specifically, multilayers were etched using a gas mixture of 38% $CHF_3$, 60% $Cl_2$, and 2% $O_2$, 50 watts RF, 350 watts ICP, 10 mTorr, and room temperature in FIG. 11A; and using a gas mixture of 48% $CHF_3$, 50% $Cl_2$, and 2% $O_2$, 50 watts RF, 350 watts ICP, 10 mTorr, and room temperature in FIG. 11B. FIGS. 11A and 11B are SEM cross-section micrographs of $WSi_2$/Si multilayers that were etched under these conditions. These figures show a pillar exhibiting straight sidewalls and about a 12.4 micron deep etch in FIG. 11A and a 21 μm deep trench in FIG. 11B. FIGS. 11A and 11B demonstrates that a highly anisotropic profile (90°±1° with very smooth sidewalls was obtained through the entire depth of the multilayer. By increasing the ion energy, the etch rate was enhanced to about 120 nm per minute.

Similar results are found in FIGS. 12B and 12C. In FIGS. 12A through 12D, a SEM cross-section micrograph shows an etched WSi2/Si multilayer according to the second embodiment, with varying Cl-plasma. (temperature, pressure, RF power and ICP power were all kept the same.)

C. Conclusion

Sectioning of $WSi_2$/Si multilayers using the RIE component of combined RIE/ICP with a combination of fluorine-based and chlorine-based chemistry was investigated. A high level of vertical anisotropy was achieved by the preferred ratio of three gases; namely, $CHF_3$, $Cl_2$, and $O_2$. This gas mixture produced anisotropic etching of the multilayer with high selectivity between the multilayer material system and the nickel hard mask. An increase of $O_2$ concentration beyond 10% resulted in a silicon etch rate that was faster than that of $WSi_2$ as well as a premature consumption of the nickel hardmask. The preferred gas mixture was found to be 75% $Cl_2$, 2% $O_2$, and 23% $CH_3$, the preferred conditions.

Additionally, the temperature and ratio between the ICP power and RF power of the RIE component was investigated to determine the proper conditions required to maintain both straight sidewalls and minimal sidewall roughness. Temperatures well above or below 20° C. resulted in poor sidewall profiles. Also, too low of an ICP power resulted in inadequate bombardment directionality, while excessive ICP power resulted in high sidewall roughness, perhaps due to reactive species reflection or a chaotic plasma directionality. The preferred conditions were found to be about 20° C. with an ICP power of about 350 W and an RF power between about 10 W to about 50 W.

Under the preferred conditions, a passivation layer was formed on the surface of the multilayer which aided in anisotropic profile generation. Conservation of the nickel hardmask was likely assisted by a conservative usage of oxygen. Deeper etching and straighter sidewalls were achieved with this process as compared to previous work using $SF_6$ and $CF_4$. This technique shows promise for the fabrication not only of multilayer Laue lens, but also for production of higher performance zone plates and gratings.

A number of advanced structures can be realized through RIE compared to standard polishing techniques for transmission multilayer optics. FIG. 13 is a schematic representation of possible advanced structures such as multilayer sections supported by full silicon wafer or H-shaped sections.

It will be appreciated by persons skilled in the art that the present description is not limited to what has been particularly shown and described in this specification. Rather, the scope of the disclosure is defined by the claims which follow. It should further be understood that the above description is only representative of illustrative examples of embodiments. For the reader's convenience, the above description has focused on a representative sample of possible embodiments, a sample that teaches the principles of the disclosed processes. Other embodiments may result from a different combination of portions of different embodiments.

The description has not attempted to exhaustively enumerate all possible variations. The alternate embodiments may not have been presented for a specific portion of the invention, and may result from a different combination of described portions, or that other undescribed alternate embodiments may be available for a portion, is not to be considered a disclaimer of those alternate embodiments. It will be appreciated that many of those undescribed embodiments are within the literal scope of the following claims, and others are equivalent. Furthermore, all references, publications, U.S. Patents, and U.S. Patent Publications cited throughout this specification are incorporated by reference as if fully set forth in this specification.

The invention claimed is:

1. A process for etching a single layer of metal silicide or a metal silicide and silicon based multilayer material comprising,
    (a) obtaining a sample of the single layer of metal silicide or the metal silicide and silicon based multilayer material to be etched; and
    (b) performing a one-step reactive ion etching process in combination with inductively coupled plasma etching on the sample using a gas mixture containing $SF_6$ and $O_2$, and using radio frequency power, wherein the $SF_6$ is from about 89% to about 93% of the gas mixture, and the $O_2$ is from about 11% to about 7% of the gas mixture, and wherein each of either (i) the etched single layer of metal silicide or (ii) the metal silicide and silicon based multilayer each has a growth thickness between 1 and 21 microns.

2. The process according to claim 1, wherein the single layer of metal silicide or metal silicide and silicon based multilayer material is a thin single layer or thin multilayer.

3. The process according to claim 1, wherein the sample is a $WSi_2$/Si multilayer.

4. The process according to claim 1, wherein the single layer of metal silicide is $WSi_2$, $VSi_2$, or $MoSi_2$.

5. The process according to claim 1, wherein the metal silicide and silicon based multilayer is $WSi_2$/Si, $MoSi_2$/Si, $VSi_2$/Si, or any combination thereof.

6. The process according to claim 1, wherein the $SF_6$ is about 91% of the gas mixture.

7. The process according to claim 1, wherein the $O_2$ is about 9% of the gas mixture.

8. The process according to claim 1, wherein the sample is a $WSi_2$/Si multilayer.

9. The process according to claim 1, wherein the $SF_6$ is from about 90% to about 92% of the gas mixture, and the $O_2$ is from about 10% to about 8% of the gas mixture.

10. The process according to claim 1, where the $SF_6$ is about 91% of the gas mixture, and the $O_2$ is about 9% of the gas mixture.

11. The process according to claim 1, wherein the sample is a $WSi_2$/Si multilayer, the $SF_6$ is about 91% of the gas mixture, and the $O_2$ is about 9% of the gas mixture.

12. The process according to claim 1, wherein the $SF_6$ is from about 90% to about 92% of the gas mixture, and the $O_2$ is from about 10% to about 8% of the gas mixture.

13. The process according to claim 1, where the $SF_6$ is about 91% of the gas mixture, and the $O_2$ is about 9% of the gas mixture.

14. The process according to claim 1, wherein the sample is a $WSi_2$/Si multilayer, the $SF_6$ is about 91% of the gas mixture, and the $O_2$ is about 9% of the gas mixture.

15. A process for etching a single layer of metal silicide or a metal silicide and silicon based multilayer material comprising,
    (a) obtaining a sample of the single layer of metal silicide or the metal silicide and silicon based multilayer material to be etched; and
    (b) performing a one-step reactive ion etching and inductively coupled plasma etching on the sample using a gas mixture containing $CHF_3$, $Cl_2$, and $O_2$ and using radio frequency power and inductively coupled plasma power, wherein the gas mixture is about 22% to about 48% $CHF_3$, about 76% to about 50% $Cl_2$, and about 2% $O_2$.

16. A process for etching a single layer of metal silicide or metal silicide and silicon based multilayer material comprising,
  (a) obtaining a sample of the single layer of metal silicide or the metal silicide and silicon based multilayer material to be etched;
  (b) limiting the extent of etching by applying to the sample a masking material; and
  (c) performing a one-step reactive ion etching and inductively coupled plasma etching on the sample using a gas mixture containing $CHF_3$, $Cl_2$, and $O_2$ and using radio frequency power and inductively coupled plasma power wherein the gas mixture is about 23% $CHF_3$, about 75% $Cl_2$, and about 2% $O_2$.

17. The process according to claim 15, wherein the sample is a $WSi_2$/Si multilayer.

18. The process according to claim 15, wherein the gas mixture is about 22% to about 24% $CHF_3$, about 76% to about 74% $Cl_2$, and 2% $O_2$.

19. The process according to claim 15, wherein the gas mixture is about 23% $CHF_3$, about 75% $Cl_2$, and about 2% $O_2$.

20. The process according to claim 15, wherein the $CHF_3$ is about 23% of the gas mixture.

21. The process according to claim 15, wherein the $Cl_2$ is about 75% of the gas mixture.

22. The process according to claim 15, wherein the $O_2$ is about 2% of the gas mixture.

23. The process according to claim 15, wherein the radio frequency power is from about 10 to about 50 watts.

24. The process according to claim 15, wherein the inductively coupled plasma power is about 350 watts.

25. The process according to claim 15, further comprising the step of adjusting the pressure, wherein the pressure is about 10 mTorr.

26. The process according to claim 15, further comprising the step of adjusting the temperature, wherein the temperature is about room temperature.

27. The process according to claim 15, further comprising the step of adjusting the temperature, wherein the temperature is from about 20° C. to about 25° C.

28. The process according to claim 16, wherein the masking material is hard-mask or a photo-resist.

29. The process according to claim 16, wherein the masking material is a Ni- or Cr-hardened mask.

30. The process according to claim 16, wherein the masking material is a Ni-hardened mask.

31. The process according to claim 16, wherein the masking material is a polymethylmethacrylate resist.

32. The process according to claim 15, wherein the masking material is a chemically amplified, epoxy based negative resist.

33. The process according to claim 15, wherein the masking material is a copolymer resist.

34. The process according to claim 16, wherein the masking material is a mixture of polymethylmethacrylate and methacrylic acid.

35. The process according to claim 15, further comprising the step of limiting the etching by applying a nickel hard-mask to the surface of the sample.

36. The process according to claim 16, wherein the sample is a $WSi_2$/Si multilayer having a nickel hard-mask, the radio frequency power is from about 10 to about 50 watts, the inductively coupled plasma power is about 350 watts, the pressure is about 10 mTorr, and the temperature is about room temperature.

37. A series of etched tungsten silicide/silicon multilayers comprising etched metal silicide and silicon based multilayers having a growth thickness of between 1 and 21 microns after being one-step etched by reactive ion etching alone or in combination with inductively coupled plasma etching using a gas mixture containing $SF_6$ and $O_2$, wherein the $SF_6$ is about 91% of the mixture and the $O_2$ is about 9% of the mixture.

38. A series of etched tungsten silicide/silicon multilayers comprising sidewalls, a surface, and a passivation layer on said surface after being one-step etched by reactive ion etching and inductively coupled plasma etching using a gas mixture containing $CHF_3$, $Cl_2$, and $O_2$ to the sample, wherein the $CHF_3$ is about 23% of the mixture, the $Cl_2$ is about 75% of the mixture, and the $O_2$ is about 2% of the mixture.

* * * * *